United States Patent
Hoffmann

(10) Patent No.: US 7,122,805 B2
(45) Date of Patent: Oct. 17, 2006

(54) FIELD EMITTER BEAM SOURCE AND METHOD FOR CONTROLLING A BEAM CURRENT

(75) Inventor: Kurt Hoffmann, Taufkirchen (DE)

(73) Assignee: ICT, Integrated Circuit Testing Gesellschaft fur Halbleiterpruftechnik mbH, Heimstetten (DE)

( * ) Notice: Subject to any disclaimer, the term of this patent is extended or adjusted under 35 U.S.C. 154(b) by 79 days.

(21) Appl. No.: 10/729,839

(22) Filed: Dec. 6, 2003

(65) Prior Publication Data

US 2004/0183456 A1 Sep. 23, 2004

(30) Foreign Application Priority Data

Dec. 6, 2002 (EP) .................................. 02027286

(51) Int. Cl.
*H01T 23/00* (2006.01)
(52) U.S. Cl. .................. 250/423 F; 313/497; 438/486; 315/160
(58) Field of Classification Search ............ 250/423 F, 250/423 R, 346 R, 492.23, 492.2; 313/495–497, 313/309, 310, 336, 351, 423; 315/160, 167, 315/169.3, 169.4, 106, 107; 438/486, 795
See application file for complete search history.

(56) References Cited

U.S. PATENT DOCUMENTS

| | | | |
|---|---|---|---|
| 5,359,256 A | 10/1994 | Gray | ........................... 313/306 |
| 5,977,719 A | 11/1999 | Makishima | ............... 315/169.1 |
| 6,320,319 B1 * | 11/2001 | Iwai et al. | .................. 315/106 |
| 6,372,612 B1 * | 4/2002 | Ito et al. | ...................... 438/486 |
| 6,429,439 B1 * | 8/2002 | Marsh | ..................... 250/423 F |
| 6,476,548 B1 * | 11/2002 | Xia | .............................. 313/497 |
| 6,596,612 B1 * | 7/2003 | Ito et al. | ...................... 438/486 |
| 6,639,353 B1 * | 10/2003 | Chadha | ....................... 313/496 |

FOREIGN PATENT DOCUMENTS

| | | |
|---|---|---|
| EP | 0 434 370 A2 | 6/1991 |
| EP | 0 780 879 B1 | 10/2001 |
| EP | 1 249 855 A1 | 10/2002 |

OTHER PUBLICATIONS

Kanemaru, et al., "Control of Emission Currents from Silicon Field Emitter Arrays using a Built-In MOSFET," Applied Surface Science 111 (1997) 218-223.

Lu, et al., "A High Speed Circuit Scheme for Driving Field Emission Array," 9th Int'l Vacuum Microelectronics Conference, St. Peterburg 1996.

* cited by examiner

*Primary Examiner*—Wilson Lee
(74) *Attorney, Agent, or Firm*—Patterson & Sheridan, L.L.P.

(57) ABSTRACT

The present invention refers to a field emitter beam source (10) comprising at least one emitter (11); at least one extracting electrode (19) to extract a beam current ($I_E$) from the emitter (11); a current source (12) for providing a predetermined beam current ($I_{E0}$); a first voltage source (13) for providing a first voltage ($U_A$) between the emitter (11) and the extracting electrode (19) to switch on the beam current ($I_E$); and a first switch ($S_1$) for disconnecting the first voltage source (13). With such a field emitter beam source, the emitter voltage ($U_E$) necessary to emit a predetermined beam current ($I_{E0}$) can be determined. This in turn enables the field emitter beam source (10) to generate beam current pulses with a fast rise time and a well defined beam current pulse charge Q.

44 Claims, 16 Drawing Sheets

|  | $S_1$ | $S_2$ | $S_3$ |
|---|---|---|---|
| $t_1$ | — | ON | X |
| $t_2$ | — | — | — |
| $t_3$ | — | — | ON |
| $t_4$ | — | — | — |
| $t_5$ | — | ON | — |
|  | — | — | — |
| $t_6$ | ON | — | — |
|  | — | — | — |
| $t_7$ | — | ON | — |
|  | — | — | — |
| $t_8$ | ON | — | — |
|  | — | — | — |
| $t_9$ | — | ON | — |
|  | — | — | — |

|  | $S_1$ | $S_2$ | $S_3$ | $S_4$ |
|---|---|---|---|---|
| $t_1$ | — | ON | — | ON |
| $t_2$ | — | — | — | ON |
| $t_3$ | — | — | ON | ON |
| $t_4$ | — | — | — | ON |
|  | — | — | — | — |
| $t_5$ | — | ON | — | — |
|  | — | — | — | — |
| $t_6$ | ON | — | — | — |
| $t'_6$ | — | — | — | — |
| $t_7$ | — | ON | — | — |
|  | — | — | — | — |
| $t_8$ | ON | — | — | — |
| $t'_8$ | — | — | — | — |
| $t_9$ | — | ON | — | — |
|  | — | — | — | — |

Fig. 3d

FIELD EMITTER BEAM SOURCE AND METHOD FOR CONTROLLING A BEAM CURRENT

CROSS-REFERENCE TO RELATED APPLICATIONS

This application claims benefit of co-pending European patent application Serial No. EP 02 027 286.0 filed Dec. 6, 2002, and is herein incorporated by reference in its entirety.

BACKGROUND OF THE INVENTION

1. Field of the Invention

The invention relates to a field emitter beam source to emit a beam current and a method for controlling a beam current. The invention also relates to an array of field emitter beam sources.

2. Description of the Related Art

Field emitter beam sources are devices to generate beams of electrons for applications like electron microscopy, electron beam pattern generators and display technology. A field emitter beam source emits electrons at the tip of a needle (emitter tip) due to a voltage applied between the emitter tip and an extraction electrode. With a small radius of the emitter tip, even a moderate voltage between the emitter tip and the extracting electrode creates an electric field at the emitter tip that is large enough to extract electrons from the emitter tip into vacuum to form an electron beam.

It has been predicted that field emitter beam sources will replace thermal electron beam sources in many applications due to their higher brightness and smaller spot size. However, field emitter beam sources are disadvantageous in that their beam current stability is poor compared to thermal electron beam emitters. The reason for the beam instability of field emitters is that the radius of the emitter tip is usually so small (typically a few tens of nanometers or less) that the electric field at the tip of the emitters varies significantly when the surface of the emitter tip becomes contaminated or changes due to chemical or physical processes during operation. As a consequence, the emitter beam current fluctuates significantly even if the voltage between extracting electrode and emitter is kept constant. However, for most electron beam devices it is essential to have a controlled electron beam exposure of a specimen in order to obtain an even patterning of the specimen, or a good image contrast when the specimen is inspected.

It is one of the advantages of field emitter beam sources over conventional thermal emitters like tungsten hairpin filaments that field emitter beam sources can be fabricated in arrays by using micromechanical processing techniques. Arrays of integrated field emitter beam sources are also known as micro field emitter arrays. Such arrays may have thousands or even millions of emitter tips with a pitch in the range of only a few micrometers or below. Using large arrays of integrated field emitter beam sources is particularly promising in the field of electron beam lithography. While electron beam lithography offers a potential for much higher spatial resolution capabilities than, e.g., masking technology, it presently suffers from low throughput due to the lengthy process of one beam "writing" a structure. With multiple electron beams in parallel however, electron beam lithography can achieve a throughput which one day may enable it to replace present masking technology.

However, the requirement to stabilize the beam currents of not only one but of a large array of field emitter beam sources poses even larger problems since each field emitter beam source has a different current-voltage behavior due to the high sensitivity to fabrication irregularities. Further, for each field emitter beam source, the current-voltage behavior may change over time which makes it even harder to provide an even electron exposure over the specimen. One way to improve the beam current stability is to control the beam current electronically by using a current source circuit for each emitter. A current source is capable of providing a constant beam current independent of a contamination or deformation of the emitter, since with a current source, the voltage between the extracting electrode and the emitter is free to adjust itself to a value where the current tunneling through the emitter surface-vacuum barrier (Schottky-Barrier) matches the current provided by the current source. Current source circuits that control the current through a field emitter are known, e.g. from U.S. Pat. No. 5,359,256. There, the drain of a field effect transistor (FET) is connected to a field emitter, and the current through the emitter is controlled by the voltage between the gate and the source of the FET.

The patterning of a specimen by means of an electron beam is usually performed by a scan where the beam current of electrons is switched on and off when it is directed from one spot on the specimen to the next. This requires the field emitter beam sources to generate fast beam current pulses in order to scan a specimen with high spatial resolution within a reasonable time. Therefore, the beam current pulses should have short rise and fall times in the range of a few nanoseconds or less in order to meet standard throughput requirements. However, with present field emitter beam source arrays that use current sources for beam current control, it is impossible to achieve such fast rise and fall times due to the inherently limited current of the current sources and the unavoidable parasitic capacitances, $C_P$ which are in parallel with the current source and which have to be charged and discharged for each beam current pulse.

As an example, the time $\Delta t$ for charging a parasitic capacitance, $C_p$, of typically 10 fF with a current source providing a beam current, $I_E$, of typically 10 nA to provide a switching voltage $\Delta U=5$ Volt to switch on the beam current $I_E$ can be estimated to be $\Delta t=5$ μm, using the relationship $\Delta t = C_E \Delta U/I_E$. Obviously, 5 μm is much too long for practical use. However, it is difficult to decrease the charging time, since it is difficult to (a) reduce the voltage $\Delta U$, i.e. the voltage change necessary to switch on the beam current from zero to a beam current of a few nanoamperes; (b) reduce the parasitic capacitance $C_p$, which represents the stray capacitance of the emitter when it is connected with the current source; or (c) increase the current $I_E$ without worsening the focussing quality of the electron beam.

SUMMARY OF THE INVENTION

It is therefore an object of the present invention to provide an improved field emitter beam source, an improved field emitter beam source array, an improved electron beam device and a method for generating beam current pulses which do not show the above mentioned disadvantages.

In particular, it is an object of the present invention to provide an improved field emitter beam source, an improved field emitter beam source array, an improved electron beam device and an improved method for generating beam current pulses that is able to structure or inspect a specimen with high throughput and high precision.

It is another object of the present invention to provide an improved field emitter beam source, an improved field emitter beam source array, an improved electron beam device and an improved method for beam current pulses that is able to structure or inspect a specimen homogeneously.

According to one aspect of the present invention, an improved field emitter beam source is provided as specified in independent claim 1. According to a second and third aspect of the present invention, improved field emitter beam source arrays are provided as specified in the independent claims 15 and 16. According to a fourth aspect of the present invention, an electron beam device is provided as specified in independent claim 26. According to a fifth aspect of the present invention, a method for generating beam current pulses is provided as specified in independent claim 27.

Further advantages, features, aspects, and details of the invention are evident from the dependent claims, the description and the accompanying drawings. The claims are intended to be understood as a first non-limiting approach of defining the invention in general terms.

Therefore, a field emitter beam source is provided having an emitter, an extracting electrode to extract a beam current from the emitter, and a current source for providing a predetermined beam current $I_{E0}$. The current source is further coupled to a first voltage source. If the first voltage source is directly connected with the current source, the first voltage source can be made to provide a first voltage $U_A$ between the emitter and the extracting electrode to switch on the beam current $I_E$. The field emitter beam source further comprises a first switch S1 for disconnecting the first voltage source from the current source. In this case, the current source can be made to provide a constant beam current for the field emitter beam source. The present invention therefore provides a field emitter beam source that is capable of providing a predetermined beam current $I_{E0}$ that is given by the beam current $I_S$ of the current source, and, after switching the first switch S1, of providing a beam current $I_E$ that is given by the first voltage provided between the emitter and the extracting electrode.

Voltage control mode and current control mode both have advantages and disadvantages for generating a beam current with a field emitter beam source. For example, voltage control enables the beam current to be switched on quickly due to the large current that a voltage source can provide at a constant voltage. However, a voltage control is poor in providing a stable, predetermined beam current for a field emitter beam source due to the high sensitivity of the beam current to unavoidable contamination or deformation of the emitter and extracting electrode. Current control, in contrast, enables the field emitter beam source to emit electrons having a stable, predetermined beam current that is essentially independent of contamination or deformation of the emitter. However, the current source is slow in switching on a beam current due to its inherently limited current.

The present invention is therefore based on the idea to combine the advantages and avoid the disadvantages of both operational modes. More precisely, the present invention can be seen in the provision of a field emitter beam source that can quickly be switched from a voltage control mode to a current control mode and vice versa while providing a predetermined beam current $I_{E0}$ in both modes.

The present invention is also based on the idea to use a current source as a calibration means to determine a required emitter voltage $U_{E0}$. The required emitter voltage $U_{E0}$ is defined as the voltage between the emitter and the extracting electrode necessary to generate the predetermined beam current $I_{E0}$. As a calibration means, the current source provides the predetermined beam current $I_{E0}$ for the emitter, which causes the emitter voltage $U_E$ to adjust itself to the required emitter voltage $U_{E0}$. The emitter voltage $U_E$ in turn can be measured to obtain the required emitter voltage $U_{E0}$. With a known required emitter voltage $U_{E0}$, the first voltage $U_A$ of the first voltage source can be adjusted to the required emitter voltage $U_{E0}$. With the first switch S1 switched to connect the first voltage source (voltage control mode) and with the first voltage $U_A$ adjusted to the required emitter voltage $U_{E0}$, the predetermined beam current $I_{E0}$ is provided as long as the contamination or deformation of the emitter or extracting electrode remains small. This way, beam current pulses can be generated which not only have a fast rise time but also deliver a predetermined beam current $I_{E0}$. If the contamination or deformation of the emitter or extracting electrode increases over time to change the beam current $I_E$, the calibration procedure can be carried out again.

The term "field emitter beam source" according to the invention is to be understood in a broad sense. The term includes any device which is capable of emitting electrons from a tip of a solid state body into free space, whereby the emission is facilitated by an electrical field surrounding the tip of the solid state body. The solid state body, preferably a semiconductor material or a metal, is also called emitter. The field emitter beam source includes at least one extracting electrode to apply an emitter voltage $U_E$ between the emitter and the extracting electrode. The emitter voltage $U_E$ preferably generates the electrical field surrounding the tip of the emitter to extract electrons from the surface of the emitter into the vacuum. The term "field emitter beam source" therefore includes cold field emission beam sources as well as thermal field emission beam sources or Schottky field emission beam sources, the latter two being heated for operation in addition to the applied electrical field.

The field emitter beam source according to the invention includes a current source which is capable of providing a predetermined beam current $I_{E0}$. In one preferred embodiment of the invention, the current source is electrically connected with the emitter of the field emitter beam source. In this case, the predetermined beam current $I_{E0}$ is equal to the current of the electrons emitted by the emitter. Preferably, the current source is electrically directly connected with the emitter, i.e., a DC current can flow from the emitter to the current source.

In another preferred embodiment of the invention, the current source is electrically connected with the extracting electrode of the field emitter beam source. In this case, the predetermined beam current $I_{E0}$ is equal to the current of the electrons intercepted by the extracting electrode. In this case, only the difference of the current emitted by the emitter and the current intercepted by the extracting electrode is available for an electron beam reaching an anode or a specimen. Preferably, the current source is electrically directly connected with the extracting electrode, i.e. a DC current can flow from the extracting electrode to the current source.

Independent of whether the current source is connected with the emitter or with the extracting electrode, the current of the current source may be connected with a fourth switch S4 to connect or disconnect the current source with/from the emitter or the extracting electrode. When disconnected, the source current $I_S$ of the current source does not interfere with the first voltage source when the first switch S1 has connected the first voltage source.

In one preferred embodiment of the invention, the current source includes a transistor with the drain (or collector) connected with the emitter of the field emitter beam source. In this design, the beam current is preferably controlled by a gate-source voltage $U_{GS}$ (or base-emitter voltage) of the transistor. Such a design is simple and represents a space saving realization of a current source.

The field emitter beam source according to the invention further includes a first voltage source for providing a first voltage $U_A$ between the emitter and the extracting electrode to switch on the beam current $I_E$. This implies that the first voltage source increases the emitter voltage $U_E$ between the emitter and the extracting electrode when the beam current is to be switched on. Preferably, the first voltage source is capable of delivering a higher current than the predetermined beam current $I_{E0}$ of the current source. Therefore, with the first voltage source, the beam current $I_E$ can be switched on faster than with a current source due to a faster discharging of the unavoidable parasitic capacitances Cp. Preferably, the first voltage source is capable of delivering a current which is preferably at least 10 times and preferably at least 100 or 1000 times larger than the source current $I_S$ of the current source without a significant voltage drop.

Preferably, the first voltage source is an adjustable voltage source. This way, the first voltage source can be adjusted to provide the required emitter voltage $U_{E0}$ between the emitter and the extracting electrode. This way, the field emitter beam source can be operated in the voltage control mode and still provide a predetermined beam current $I_{E0}$ as long as no additional contamination of the emitter or extracting electrode changes the characteristic voltage-current (V-I) curve of the field emitter beam source.

The field emitter beam source according to the invention is provided with a first switch S1 for disconnecting the first voltage source. In a first preferred embodiment, the first switch S1 is connected with the emitter and the first voltage source to alternately connect or disconnect the first voltage source from the emitter. This is advantageous in the case where the extracting electrode is kept at a constant potential while the current source is connected with the emitter. In a second preferred embodiment of the invention, the first switch S1 is connected with the extracting electrode and the first voltage source to alternately connect or disconnect the first voltage source from the extracting electrode. This is advantageous in the case where the emitter is kept at a constant potential while the current source is connected with the extracting electrode. In a third preferred embodiment of the invention, the first switch S1 is connected with the current source and the first voltage source to alternately connect or disconnect the first voltage source. This is advantageous because it minimizes the parasitic emitter capacitance Cp parallel to the current source. In all three embodiments, the first switch S1 is preferably used to switch quickly from voltage control mode (S1 in ON-state) to current control mode (S1 in OFF-state) and vice versa.

Preferably, when the first switch S1 is in the OFF-state, the first voltage source is electrically disconnected from the emitter (or from the extracting electrode) to such a degree that the first voltage $U_A$ essentially does not interfere with the current source. In a preferred embodiment of the invention, the first switch S1 is a transistor where the gate (base-) voltage is used to change the transistor channel from low resistance (ON-state) to high resistance (OFF-state) or vice versa.

Preferably, the field emitter beam source comprises a second voltage source for providing a second voltage $U_B$ between the emitter and the extracting electrode to switch off the beam current $I_E$. Using a voltage source for switching off the beam current allows the beam current to be switched off fast. In this way, the field emitter beam source can generate beam current pulses with a fast rise time and a fast fall time which is a prerequisite for generating short pulses at a high rate. Again, the second voltage source can be any device or spot which is able to provide sufficient current to maintain the second voltage $U_B$ between the emitter and the extracting electrode. Preferably, the second voltage source is capable of delivering a current which is preferably at least 10 times and preferably at least 100 or 1000 times larger than the source current $I_S$ of the current source without causing the second voltage source to have a significant voltage drop. Preferably, the second voltage $U_B$ is smaller than the first voltage $U_A$ in order to reduce the electric field between the emitter and the extracting electrode for switching off the beam current. In another preferred embodiment of the invention, the second voltage $U_B$ is zero. In this case, the second voltage source may be the reference voltage $U_{REF}$ to which the emitter voltage $U_E$ is referred.

Preferably, the field emitter beam source comprises a second switch S2 for disconnecting the second voltage source. Again, in a first preferred embodiment, the second switch S2 is connected with the emitter and the second voltage source to alternately connect or disconnect the second voltage source from the emitter. This is advantageous in the case where the extracting electrode is kept at a constant potential while the current source is connected with the emitter. In a second preferred embodiment of the invention, the second switch S1 is connected with the extracting electrode and the second voltage source to alternately connect or disconnect the second voltage source from the extracting electrode. This is advantageous in the case where the emitter is kept at a constant potential while the current source is connected with the extracting electrode. Preferably, the second switch S2 is connected with the current source and with the second voltage source to alternately connect or disconnect the second voltage source from the current source. This is advantageous because it minimizes the parasitic emitter capacitance Cp parallel to the current source.

Preferably, when the second switch S2 is in the OFF-state, the second voltage source is electrically disconnected from the emitter to such a degree that the second voltage $U_B$ of the second voltage source essentially does not interfere with the source current or with the first voltage source. Again, in a preferred embodiment of the invention, the second switch S2 is a transistor where the gate (base-) voltage is used to change the transistor channel from low resistance (ON-state) to high resistance (OFF-state) or vice versa.

In one preferred embodiment, the field emitter beam source comprises a fourth switch S4 for disconnecting the current source. Preferably, the fourth switch S4 is used to alternately disconnect and connect the current source. With the fourth switch S4 disconnecting the current source and the first switch S1 disconnecting the second voltage source, the beam current $I_E$ can be switched off without using a second voltage source. Further, with the fourth switch S4 disconnecting the current source, the current source cannot interfere with the first voltage source and/or the second voltage source.

Further, disconnecting the current source provides a means to electrically insulate the emitter (or the extracting electrode). In this state, the emitter voltage $U_E$ is given by the unavoidable parasitic capacitance Cp and a charge q stored on the emitter capacitance ($U_E$=q/Cp). As will be explained later, the configuration where the emitter (or the extracting electrode) is electrically insulated enables the field emitter beam source to be operated in a mode where the beam current pulse length is controlled by the charge deposited on the parasitic capacitance Cp.

Preferably, the field emitter beam source comprises a voltage control unit to adjust the first voltage $U_A$. This way, the first voltage $U_A$ can be adjusted automatically to the required emitter voltage $U_{E0}$ to generate the predetermined beam current $I_{E0}$. Preferably, the voltage control unit is electrically connected with the first voltage source to adjust the first voltage $U_A$. Preferably, the voltage control unit is electrically connected with the current source to measure a measured emitter voltage $U_{EM}$ at the current source. This way, the voltage control unit can adjust the first voltage $U_A$ according to the measured emitter voltage $U_{EM}$. Preferably, the measured emitter voltage value $U_{EM}$ is measured at a time when the beam current of the field emitter beam source is controlled by the current source. This way, the measured emitter voltage $U_{EM}$ is equal to the required emitter voltage $U_{E0}$. Preferably, the first voltage source is capable of providing the adjusted first voltage $U_A$ for a given time period. During the time period, the field emitter beam source can be operated in the voltage control mode to generate beam current pulses with a fast rise time and a predetermined beam current $I_E$.

Preferably, the voltage control unit comprises a storing unit to store the measured emitter voltage $U_{EM}$. Preferably, the storing unit stores an analogue voltage. The storing of the measured emitter voltage $U_{EM}$ enables the voltage control unit to keep the first voltage $U_A$ adjusted for some time period. Preferably, the time period is matched to the rate at which the emitter or extracting electrode contaminates or deforms. In this case, the field emitter beam source can be operated in the voltage control mode where at the same time the beam current of the beam current pulses is equal or close to the predetermined beam current.

Preferably, the voltage control unit comprises a third switch S3 to determine the time at which the measured emitter voltage $U_{EM}$ is measured. Preferably, the third switch S3 is located between the current source and the storing unit in order to electrically connect or disconnect the storing unit from the current source. This way it is possible to control the time at which the measured emitter voltage $U_{EM}$ is measured and how long it is stored. In particular, preferably, when the third switch S3 is in the ON-state, the previously stored measured emitter voltage $U_{EM}$ becomes overwritten by a new measured emitter voltage $U_{EM}$.

Preferably, the voltage control unit comprises a sample-and-hold circuit for sampling and storing the measured emitter voltage $U_{EM}$. In one preferred embodiment, the voltage control unit comprises an n-channel MOSFET source follower whose input side is connected with the emitter (or extracting electrode) and whose output side is connected with a third switch S3. Preferably, if the voltage control unit comprises an n-channel MOS-FET source follower, the first voltage source comprises a p-channel MOS-FET source follower whose input side is connected with the third switch S3.

In another preferred embodiment, the voltage control unit comprises a p-channel MOSFET source follower whose input side is connected with the emitter (or extracting electrode) and whose output side is connected with a third switch S3. Preferably, if the voltage control unit comprises a p-channel MOS-FET source follower, the first voltage source comprises an n-channel MOSFET source follower whose input side is connected with the third switch S3. Preferably, the input side of the first voltage source is connected with the third switch S3 in order for the first voltage $U_A$ to be adjusted according to the measured emitter voltage $U_{EM}$. Preferably, the input side of the first voltage source is further connected with a storing capacitance CSH to store a charge according to the measured emitter voltage $U_{EM}$.

Preferably, the field emitter beam source is further characterized by charge control means to control the switch off time of the beam current $I_E$. Preferably, the switch off time is determined by a predetermined beam current pulse charge Q emitted by the beam current pulse. Preferably, the charge control means provide a means to automatically switch off the beam current pulse when the predetermined beam current pulse charge Q has been emitted. This way, each beam current pulse can be made to emit essentially the same charge Q independent of the beam current fluctuations over time. Further, it is possible that each field emitter beam source of an array of field emitter beam sources emits the same beam current pulse charge Q independent of mechanical differences of the emitters due to manufacturing or contamination. A same charge of the beam current pulses is highly advantageous for inspecting or structuring a specimen, since it is mainly the charge which defines the structures or which provides information for inspection.

Preferably, the charge control means comprise a fourth switch S4 for disconnecting the current source. This way, it is possible to insulate the emitter (or the extracting electrode). If insulated, the emitter voltage $U_E$ is defined by the charge stored on the parasitic capacitance Cp. If the charge is large, the emitter voltage $U_E$ may be sufficient for the field emitter beam source to emit a beam current $I_E$. If the field emitter beam source is emitting, the emitter voltage $U_E$ decreases to a degree which can be measured. Therefore the fourth switch S4 can be used as a means to control the charge emitted by the field emitter beam source.

Preferably, the charge control means further comprise a comparator. Preferably, the comparator is connected with the emitter (or the extracting electrode) to compare the emitter voltage $U_E$ with a predetermined comparison voltage $U_{CMP}$. Preferably, the comparator is capable of signaling when the emitter voltage $U_E$ has decreased below the comparison voltage $U_{CMP}$. This way, the charge control means automatically signals when a predetermined beam current pulse charge Q has been emitted into free space.

Preferably, the output of the comparator is connected with the second switch S2 to switch off beam current $I_E$. This way, the comparator can be used to automatically switch off the beam current $I_E$ when a predetermined beam current pulse charge Q has left the parasitic capacitance CP. This way, the comparator is capable of adjusting the beam current pulse length where each beam current pulse contains essentially the same predetermined beam current pulse charge Q.

Preferably, the field emitter beam source is an array of field emitter beam sources. An array of field emitter beam sources according to the invention can be used to generate many electron beams having predetermined beam currents $I_{E0}$ in parallel. Preferably, the current sources of the field emitter beam source have the same design. This way, the predetermined beam currents $I_{E0}$ of the array of field emitter beam sources are essentially equal to structure or inspect a specimen with electron beams having the same predetermined beam current $I_{E0}$. In a preferred embodiment of the invention, arrays of field emitter beam sources use the same current source to further improve the homogeneity of the predetermined beam currents $I_{E0}$.

Preferably, the array of field emitter beam sources is fabricated using CMOS-technology. This way, current sources, voltage sources, switches, the voltage control units and/or charge control means can be manufactured using the advantages of CMOS-technology. CMOS-technology is a standard process for the manufacture of electronic circuits with p-channel field-effect transistors and n-channel field-effect transistors onto monolithic silicon substrates with structure sizes down to 100 nm or less. This way, it is possible to manufacture densely packed arrays of field emitter beam sources where each field emitter beam source has its own dedicated current source, voltage sources, switches, voltage control unit and/or charge control means.

Preferably, the predetermined beam current $I_E$ is in the range between 1 microampere and 10 picoampere, preferably between 100 nanoampere and 100 picoampere and even more preferred between 20 nanoampere and 1 nanoampere. The small beam current allows the charged particle beam to be focussed to a small focus size to provide a high spatial resolution.

Further, the present invention includes a field emitter beam source array according to claim 16. The field emitter beam source array according to claim 16 is an array of field emitter beam sources integrated onto a semiconductor substrate. Therefore, the field emitter beam source array can be fabricated using standard microelectronic fabrication methods, which make it possible to integrate thousands and even millions of field emitter beam sources onto a single semiconductor substrate.

According to claim 16, each field emitter beam source comprises a current source to provide a predetermined beam current $I_{E0}$. This way, each field emitter beam source is provided with a means to individually calibrate the field emitter beam source, e.g. each field emitter beam source can be provided with a known predetermined beam current to obtain the required emitter voltage $U_{E0}$. The required emitter voltage $U_{E0}$ in turn is used to operate each field emitter beam source in the voltage control mode with a calibrated emission current. Preferably, the current source of a field emitter beam source is electrically connected with the emitter of the field emitter beam source.

Further, according to claim 16, field emitter beam source comprises a first switch S1 which is connected with a first voltage source to switch on a beam current $I_E$. With the first voltage source, the beam current $I_E$ of each field emitter beam source can be switched on fast. Preferably, the first switch S1 is electrically connected with the emitter of the corresponding field emitter beam source. Further, according to claim 16, each field emitter beam source comprises a second switch to switch off the beam current $I_E$. This way, each field emitter beam source can be switched off at independent times, which may be used to adjust the beam current pulse lengths of the varies field emitter beam sources according to a given emitted beam current pulse charge Q.

Preferably, the second switch is connected with a second voltage $U_B$. Preferably, the second voltage $U_B$ is at a voltage which is smaller than the first voltage $U_A$ in order to switch off the beam current $I_E$. In a preferred embodiment, each emitter is electrically connected with the current source by means of a fourth switch S4. This way, it is possible to disconnect each emitter or extracting electrode from the current source. This way, the beam current can be switched off. Further, the fourth switch S4 can be used to alternately connect and disconnect the current source from the emitter to operate each field emitter beam source in a mode where the total charge of each emitter beam current pulse is automatically controlled. Automatic control of the beam current pulse charge Q of each field emitter beam source is essential for large arrays of field emitter beam sources to keep beam current pulse control simple.

Preferably, each field emitter beam source comprises a voltage control unit to adjust the first voltage $U_A$ according to a measured emitter voltage $U_{EM}$. Preferably, the measured emitter voltage $U_{EM}$ is measured at the current source. With the measured emitter voltage $U_{EM}$, the voltage control unit can adjust the first voltage $U_A$ to the required emitter voltage $U_{E0}$ necessary to generate a predetermined beam current $I_{E0}$. This way, the beam current pulses can made to have a predetermined beam current $I_{E0}$ in the voltage control mode.

Preferably, each field emitter beam source comprises a charge control means to control the switch off time of the beam current $I_E$ according to a predetermined beam current pulse charge Q. This way, each field emitter beam source is capable of automatically generating beam current pulses having essentially the same beam current pulse charge Q.

Preferably, each field emitter beam source comprises an emitter whereby each emitter is electrically connected with one of said current sources, one of said first switches, one of said second switches, one of said voltage control units, and/or one of said charge control means. In this case, the extracting electrode is kept at a constant potential. An extracting electrode with a constant potential is advantageous for focussing the beam current $I_E$ emitted by the emitter because the electric field between the extracting electrode and a collector anode remains stable while the emitter is free to adjust the emitter voltage $U_E$ to generate a predetermined current.

In one preferred embodiment, the second voltage source is common to all field emitter beam sources. Since the second voltage $U_B$ for switching off the beam current $I_E$ is not critical, it is sufficient to use the same second voltage $U_B$ for all field emitter beam source. This simplifies the operation of the many field emitter beam sources and makes the provision of individual second voltage sources for each field emitter beam source obsolete.

Preferably, the number of field emitter beam sources of the field emitter beam source array is larger than four, preferably, larger than 1000 and even more preferred larger than 100,000. The more field emitter beam sources a field emitter beam source array comprises, the higher the throughput for inspecting or structuring a specimen. The upper limit of the number of field emitter beam sources is mainly limited by the adressability of the field emitter beam sources and the size of the chip on which the array is integrated.

In another aspect of the present invention, an electron beam device is provided which comprises at least one of the field emitter beam sources and/or at least one field emitter beam source arrays according to any of the preceding claims. The electron beam device can be any device which uses one or several of the electron beams generated by the field emitter beam sources and/or by the field emitter beam source arrays according to the invention to structure a specimen, to inspect a specimen or to direct the electron beams towards a screen for display purposes.

Further, a method for generating beam current pulses is provided comprising the steps:
 a) providing a field emitter beam source having at least one emitter and at least one extracting electrode;
 b) providing a predetermined beam current $I_{E0}$ for the emitter;
 c) switching on the beam current $I_E$ by applying a first voltage $U_A$ between the emitter and the extracting electrode.

With the method according to the invention, it is possible to generate beam current pulses with a predetermined beam current $I_{E0}$ and a fast rise time. For example, by applying the first voltage $U_A$ between the emitter and the extracting electrode, a fast rise time for a beam current pulse is achieved; then, by providing a predetermined beam current $I_{E0}$, the beam current pulse can continue with a beam current $I_E$ equal to the predetermined beam current $I_{E0}$. Preferably, "applying a voltage $U_A$" implies that the voltage is a predetermined voltage generated externally, e.g. by some voltage source.

In a preferred method, the emitter voltage $U_E$ between the emitter and the extracting electrode is measured to obtain a measured emitter voltage $U_{EM}$. Preferably, the first voltage $U_A$ is adjusted to be equal to the measured emitter voltage $U_{EM}$. This way, the first voltage can be adjusted to a value that is close to the value needed for a beam current $I_E$ close to the predetermined beam current $I_{E0}$. Preferably, the emitter voltage $U_E$ is measured at a time when the predetermined beam current $I_{E0}$ is provided for the emitter. This way it is possible to determine the required emitter voltage $U_{E0}$. This is because with the emitter emitting the predetermined beam current $I_{E0}$, the emitter voltage $U_E$ adjusts itself to the required emitter voltage $U_{E0}$. In this case, preferably, the first voltage $U_A$ becomes adjusted to the required emitter voltage $U_{E0}$. With the first voltage $U_A$ adjusted to the required emitter voltage $U_{E0}$, it is possible to generate beam current pulses under voltage control where each pulse has the predetermined beam current $I_{E0}$. "Providing a predetermined beam current IE0 for the emitter" means that the emitter emits an electron beam having a current equal to the predetermined beam current IE0.

The method according to the invention includes generating a beam current pulse sequence where at first, a predetermined beam current $I_{E0}$ for the emitter is provided. In this mode, the emitter voltage $U_E$, i.e. the voltage between the emitter and the extracting electrode, adjusts itself to a voltage that allows the predetermined beam current $I_{E0}$ to be emitted into free space. Preferably, the measured voltage $U_{EM}$ is equal to the required emitter voltage $U_{E0}$. In this case, once the required emitter voltage $U_{E0}$ is known, the field emitter beam source can be switched from the current control mode to a voltage control mode by applying the required emitter voltage $U_{E0}$ between the emitter and the extracting electrode to switch on the beam current. This way, the field emitter beam source is capable of generating fast beam current pulses with a predetermined beam current $I_{E0}$, as long as the contamination of the emitter remains small. As soon as contamination of the emitter progresses to change the voltage-current behavior of the field emitter beam source again, the field emitter beam source has to be calibrated again by determining the required emitter voltage $U_{E0}$.

Preferably, the beam current $I_E$ is switched off by applying a second voltage $U_B$ between the emitter and the extracting electrode. In one preferred embodiment, the second voltage $U_B$ is provided by a first voltage source. This way, beam current pulses can be switched off fast to provide beam current pulses with a fast fall time. This way, beam current pulse sequences can be generated at a high frequency. In another preferred embodiment, the second voltage $U_B$ is zero, i.e. emitter and extracting electrode are shorted with each other when the beam current IE is switched off.

Preferably, the predetermined beam current $I_{E0}$ is provided by means of a current source. Preferably, the current source is electrically connected either with the emitter or with the extracting electrode.

Preferably, the emitter voltage $U_E$ is measured periodically within intervals of less than 100 s, preferably less than a second and even more preferred less than a millisecond. Further, preferably, the first voltage $U_A$ too is adjusted periodically within intervals of less than 100 s, preferably less than a second and even more preferred less than a millisecond. Short intervals can provide a frequent update of the required emitter voltage $U_{E0}$ to adjust the first voltage $U_A$ accordingly. With a frequent adjustment of the first voltage $U_A$, it is possible to generate beam current pulses with predetermined beam current $I_{E0}$ in the voltage control mode even when the emitter or extracting electrode becomes contaminated or deformed over time due e.g. to poor vacuum.

Preferably, between two consecutive adjustments of the first voltage $U_A$, the beam current $I_E$ is switched on at least two times, preferably at least 100 times and even more preferred at least 10,000 times. The higher the number of switch on and switch off cycles between two consecutive adjustments, the smaller the relative loss of time due to the adjustment and the measurement of the required emitter voltage $U_{E0}$.

Preferably, the first voltage $U_A$ is adjusted by means of a voltage control unit controlling the first voltage source. Preferably, the voltage control unit measures the emitter voltage $U_E$ to obtain a measured emitter voltage $U_{EM}$ and stores the measured emitter voltage $U_{EM}$ for the adjustment of the first voltage $U_A$.

Preferably, the method according to the invention includes the steps: disconnecting the current source, the first voltage source and the second voltage source from the emitter (or the extracting electrode); and switching off the beam current $I_E$ when the decreasing emitter voltage $U_E$ has reached a predetermined comparison voltage $U_{CMP}$. This method can be used to generate beam current pulses with a predetermined beam current pulse charge Q. Preferably, the switch off of the beam current $I_E$ is initiated by a voltage comparator means comparing the emitter voltage $U_E$ with the predetermined comparison voltage $U_{CMP}$.

Preferably, after switch off, the beam current $I_E$ is reduced by more than 50%, preferably by more than 90% and even more preferred by more than 99% of the predetermined beam current. This implies that the "switched off" beam current $I_E$ does not necessarily have to be zero but can also be some other value smaller than the "switched on" beam current. This is because it may require a large switching voltage $\Delta U$ between emitter and extracting electrode to switch off the beam current completely. Providing a large switching voltage $\Delta U$ may increase the rise and fall time of the beam current pulses. Therefore, the degree of the beam current switch off is a tradeoff between the desire to switch the beam current off completely and the maximum switching voltage $\Delta U$ that the user is willing to provide.

Preferably, the first voltage $U_A$ becomes connected or disconnected from the emitter or the extracting electrode by means of a first switch S1; further, preferably, the second voltage $U_B$ becomes connected or disconnected from the emitter or the extracting electrode by means of a second switch S2; and/or, preferably, the current source becomes connected or disconnected from the emitter or the extracting electrode by means of a fourth switch S4. Switches for connecting and disconnecting provide a fast and simple means to electrically separate or connect two devices from or with each other. Preferably, the switches are electronic devices like transistors. Preferably, the switches are transistors fabricated in CMOS-technology.

The first voltage $U_A$, the second voltage $U_B$, the comparison voltage $U_{CMP}$ and/or the emitter voltage $U_E$ are preferably taken either with reference to the voltage of the extracting electrode or with reference to the voltage of the emitter. In the first case, the extracting electrode is at a fixed reference potential and the voltage at the emitter is adjusted to deliver the desired beam current $I_E$, while, in the second case, the emitter is at a fixed reference potential and the voltage of the extracting electrode is adjusted to deliver the desired beam current. Of the two possibilities, it is preferred to have the extracting electrode at a fixed potential, since a fluctuating emitter produces less electric field disturbances to an electron beam on its way to a collector anode than a fluctuating extracting electrode.

BRIEF DESCRIPTION OF THE DRAWINGS

Some of the above indicated and other more detailed aspects of the invention will be described in the following description and partially illustrated with reference to the figures. Therein:

FIG. 3b shows a time diagram of a short beam current pulse sequence generated by the field emitter beam source of FIG. 3a.

FIG. 3d shows a table with the logical states of the switches S1, S2, S3 and S4 used to generate the time diagram of FIGS. 3b and 3c.

FIG. 3e shows a time diagram of a long beam current pulse sequence generated by the field emitter beam source of FIG. 3a.

FIG. 4b shows the characteristic voltage-current (V-I) curve of the field emitter beam source used for the circuit of FIG. 4a.

DETAILED DESCRIPTION OF THE PREFERRED EMBODIMENT

Figure 1:
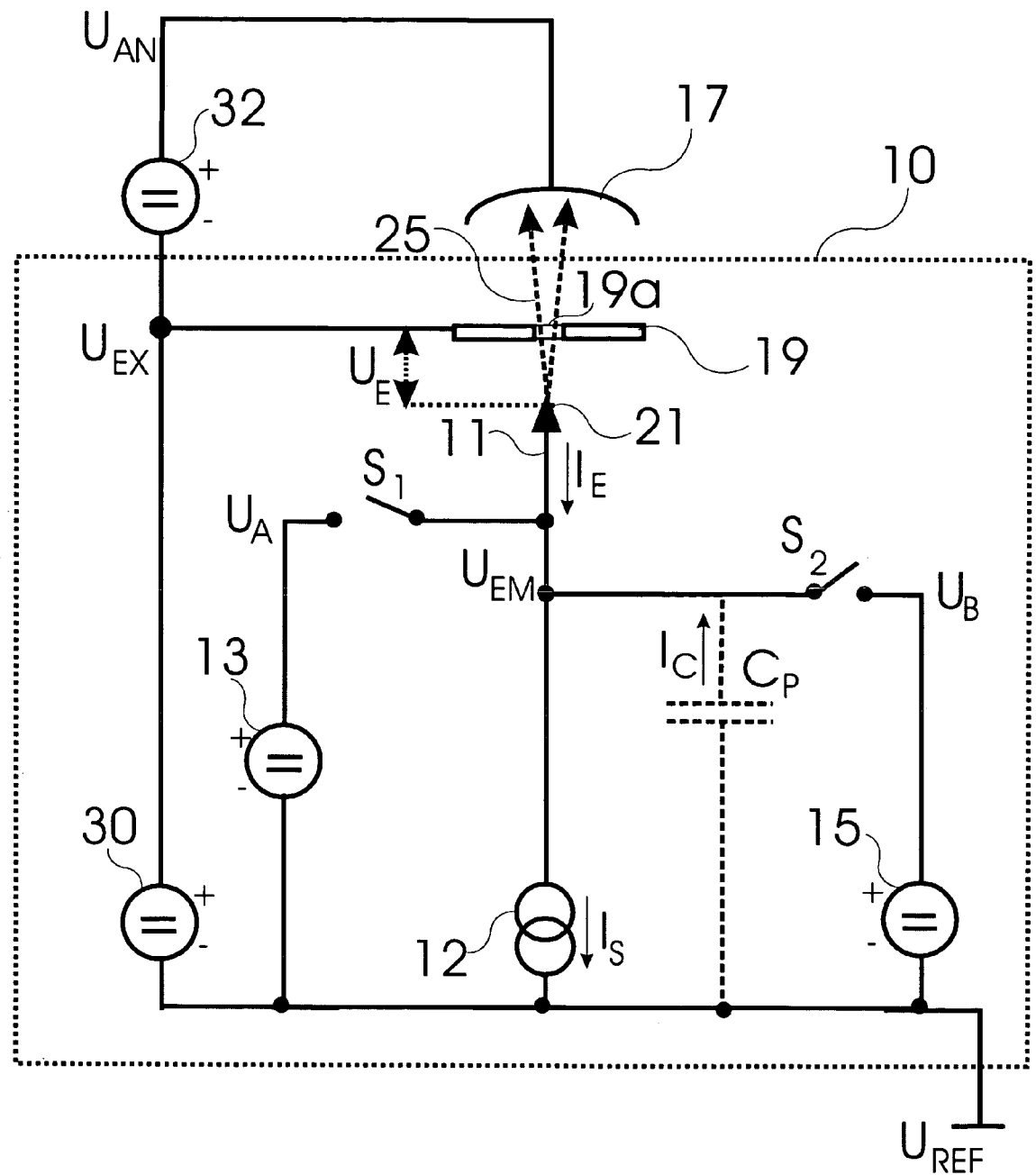
FIG. 1 shows a first field emitter beam source according to the invention with a first voltage $U_A$ for switching on the beam current $I_E$ and a second voltage $U_B$ to switch off the beam current $I_E$.

FIG. 1 illustrates schematically a field emitter beam source 10 according to one embodiment of the invention. The source 10 can be a single device or a device that is only one of an array of field emitter beam sources, e.g., integrated onto a semiconductor substrate 50 (see FIG. 5). The field emitter beam source 10 may be any of the known single field emitter beam sources having a single emitter 11, e.g., made of silicon or a tungsten wire fashioned into a sharp point, and an extracting electrode 19 facing the emitter 11 to extract electrons from the emitter tip 21.

The field emitter beam source 10 may or may not include a collector anode 17. If the collector anode 17 is included, the collector anode 17 may be any conducting body or electrode that can be provided with an electric potential to prevent the extracted electrons 25 from being fully absorbed by the extracting electrode 19. To do this, the potential of the collector anode 17, during operation, is preferably significantly more positive than the potential of the extracting electrode 19. In FIG. 1, the potential between the extracting electrode 19 and the collector anode 17, i.e. the anode voltage $U_{AN}$, is provided by the fourth voltage source 32. The collector anode 17 may be, for example, a specimen which is provided with a positive voltage to attract the extracted electron beam 25. This way, it is possible to direct the extracted electron beam 25 onto the specimen to inspect or structure the specimen. The collector anode 17 may also be part of the field emitter beam source 10 and, e.g., be integrated onto the field emitter beam source. For example, the collector anode 17 may be an electrode disposed proximate the extracting electrode 19 to direct the electron beam 25 away from the extracting electrode 19. In order for the collector anode 17 to direct the electron beam 25 away from the extracting electrode 19, the extracting electrode 19 is usually provided with one or more openings 19a through which the electron beam 25 can pass through the plane of the extracting electrode 19 to be directed by the potential of the collector anode 17.

The extraction of electrons from the surface of a solid body into vacuum by means of a high electric field is a technique well known to a person skilled in the art. For the extraction, an electric field of about $10^7$ V/cm or larger is needed at the emitting surface of the solid body. The high electric field narrows a potential barrier (Schottky-barrier) between the surface and vacuum which enables the electrons of the emitter to tunnel from the surface of the solid body into vacuum. The high electric field at the emitting surface is usually achieved by locating an extracting electrode close to the emitting surface of the solid body. Further, an increased electric field strength is achieved by having the emitting solid body formed in a needle-like shape (e.g. like a cone or a pyramid) with a tip having a small curvature radius. The smaller the curvature radius of the tip, the higher the electric field. In this case, the needle-like solid body would be the emitter 11, and the tip of the needle-like solid body would be the emitter tip 21. The electrons are usually emitted at the emitter tip 21 due to the high electric field thereon.

The emitter tip 21 can be formed in silicon if the field emitter beam source 10 is integrated on a semiconductor wafer. However, the emitter tip 11 may also be made of other semiconductor material or a metal, e.g. tungsten. In order to avoid the use of a high emitter voltage $U_E$, i.e. the voltage between emitter 11 and extracting electrode 19, it is preferred that both the curvature radius of the emitter tip 21 and the distance between emitter 11 and extracting electrode 19 are kept small. The curvature radius of the emitter tip 21 is typically in the range of a few tens of nanometers or smaller. The distance between emitter tip 21 and extracting electrode 19 is usually smaller than 10 μm. By using micromechanical processing steps, it is possible to manufacture large arrays of field emitter beam sources each having a distance between emitter tip 21 and extracting electrode 19 of less than 1 μm or even less than 0.1 μm.

For micromechanically machined field emitter beam sources, the emission of beam currents in the range of a few tens of nanoamperes typically requires an emitter voltage $U_E$ of a few tens of volts. However, larger distances between emitter tip 21 and extracting electrode 19 may require that the emitter voltage $U_E$ be well within the range of 100 to 10,000 V for standard beam operation. In the case of FIG. 1, the third voltage source 30 provides a constant extractor voltage $U_{EX}$ between the extracting electrode 19 and the reference voltage $U_{REF}$. This corresponds to the maximum emitter voltage $U_E$ between emitter 11 and the extracting electrode 19 during operation. The extractor voltage $U_{EX}$ of FIG. 1 represents the dynamic range for the emitter 11 to adjust its voltage according to the predetermined beam current $I_{E0}$.

The parameters, materials and geometry of the emitter, extracting electrode and collector anode given above are meant to describe typical features of field emitter beam sources. They are by no means intended as limiting features of the present invention, since the present invention applies to all devices where electrons are emitted from a solid body into free space by means of an electrical field.

In FIG. 1, the extracting electrode 19 is at a fixed extractor voltage $U_{EX}$, while the voltage of the emitter 11 is adjustable depending on the beam current $I_E$ to be emitted. Keeping the voltage of the extracting electrode 19 constant has the advantage that it keeps the electric field between collector anode 17 and extracting electrode 19 essentially untouched by changes of the emitter voltage $U_E$. This is an important aspect for electron beam devices which need a high focussing quality for their electron beams 25.

Further, for the sake of simplicity, voltages of the emitter 11 mentioned below, such as, the emitter voltage $U_E$, the first voltage $U_A$, the second voltage $U_B$ and the measured emitter voltage $U_{EM}$, refer to the voltage difference between the emitter 11 and the extracting electrode 19.

The beam current $I_E$ of the field emitter beam source 10 can be controlled in three different modes depending on the switching state of the first and second switch S1, S2, and on the current $I_S$ of the current source 12.

A) First switch S1=OFF and second switch S2=OFF

If the first switch S1 and the second switch S2 are both in the OFF-state, the first voltage source 13 and the second voltage source 15 are disconnected from the emitter 11. In this case, the emitter voltage $U_E$ depends on the current $I_S$ of the current source 12 and on the characteristic voltage-current (V-I) curve of the field emitter beam source (see FIG. 2). This mode is also called current control mode.

The characteristic voltage-current (V-I) curve of a field emitter beam source is usually not known beforehand and hard to predict due to the strong dependence of the beam current $I_E$ on the details of the emitter tip and extracting electrode surfaces. In addition, the characteristic voltage-current (V-I) curve often changes over time due to contamination of the surfaces of the emitter tip 21 and the extracting electrode 11 during operation. However, in the current control mode, the emitter voltage $U_E$ necessary to emit the predetermined beam current $I_{E0}$ can be measured by measuring the emitter voltage $U_E$ at the emitter 11 at a time when the emitter 11 is provided with the predetermined beam current $I_{E0}$. The emitter voltage $U_E$ measured at the time when the emitter 11 is provided with the predetermined beam current $I_{E0}$ is also called "required emitter voltage" $U_{E0}$.

B) First switch S1=ON and second switch S2=OFF

When the first switch S1 is switched into the ON-state (while the second switch S2 remains in the OFF-state), the first voltage source 13 becomes connected with the emitter 11. In this case, the emitter voltage $U_E$ becomes equal to the first voltage $U_A$, which in FIG. 1 is defined by the difference between the voltage generated by the third voltage source 30 and the voltage of the first voltage source 13. Preferably, the first voltage source 13 is an adjustable voltage source which implies that first voltage $U_A$ can be adjusted to equal the required emitter voltage $U_{E0}$ as measured in the current control mode. With the first voltage $U_A$ equal to the required emitter voltage $U_{E0}$, the emitter 11 is made to emit the predetermined beam current $I_{E0}$ under control of a voltage source (voltage control mode). Of course, the emitted beam current $I_E$ under voltage control remains constant only as long as no additional contamination of the emitter 11 or extracting electrode 19 changes the characteristic voltage-current (V-I) curve of the field emitter beam source 10.

When the first switch S1 is switched into the ON-state, the first voltage source 13 also needs to deliver the charging current $I_C$ to provide the first voltage $U_A$ across the parasitic capacitance Cp. This may slow down the rise time of a beam current pulse. However, if the output resistance of the first voltage source 13 is small enough, the rise time is much faster than the rise time of a beam current pulse generated with a current source.

C) First switch S1=OFF and second switch S2=ON

When the second switch S2 is switched into the ON-state (while the first switch S1 remains in the OFF-state), the second voltage source 15 becomes connected with the emitter 11. In this case, the emitter voltage $U_E$ becomes equal to the second voltage $U_B$, which in FIG. 1 is defined by the difference between the voltage of the third voltage source 30 and the voltage of the second voltage source 15. The voltage of the second voltage source 15 is chosen to ensure that the second voltage $U_B$ is small enough to essentially switch off the beam current $I_E$. The choice of the second voltage $U_B$ is less critical than the choice of the first voltage $U_A$ since the characteristic voltage-current (V-I) curve offers a large voltage range within which the beam current $I_E$ is essentially zero.

Table I below shows a typical operational sequence for operating the field emitter beam source 10 of FIG. 1:

TABLE I

| Time line | S1 | S2 | Control mode | Comment |
|---|---|---|---|---|
| t1 | OFF | OFF | current | Calibration: $I_E = I_{E0}$ and $U_E = U_{E0}$; $U_{E0}$ is measured; $U_A$ is adjusted to be equal to $U_{E0}$ |
| t2 | OFF | ON | voltage | $I_E$ is switched off |
| t3 | OFF | OFF | — | "Break before Make" |
| t4 | ON | OFF | voltage | $I_E$ is switched on for first beam current pulse under voltage control |
| t5 | OFF | OFF | — | "Break before Make" |

TABLE I-continued

| Time line | S1 | S2 | Control mode | Comment |
|---|---|---|---|---|
| t6 | OFF | ON | voltage | $I_E$ is switched off to end first beam current pulse under voltage control |
| t4 | OFF | OFF | — | "Break before Make" |
| t8 | ON | OFF | voltage | $I_E$ is switched on for second beam current pulse under voltage control |
| t9 | OFF | OFF | — | "Break before Make" |
| t10 | OFF | ON | voltage | $I_E$ is switched off to end second beam current pulse under voltage control |

During time period t1, the field emitter beam source 10 is in the current control mode to calibrate the field emitter beam source 10. The field emitter beam source 10 is calibrated by using the current source 12 to provide a predetermined beam current $I_{E0}$ for the emitter 11. The corresponding required emitter voltage $U_{E0}$ across the emitter 11 and the extracting electrode 19 is measured, e.g. by means of a voltage measurement device. To finish the calibration, the first voltage $U_A$ is adjusted by adjusting the first voltage source 13 to equal the required emitter voltage $U_{E0}$.

During time period t2, the field emitter beam source is changed into the voltage control mode by switching the second switch S2 into the ON-state. The beam current $I_E$ is switched off. The series of calibrated voltage controlled beam current pulses can begin.

During time period t3, the second switch S2 becomes switched into the OFF-state to "break" a connection before a new connection is "made" ("Break before Make"). This is to avoid a short between the first voltage source 13 and the second voltage source 15 at the moment when first switch S1 changes into the ON-state for switching on the beam. The "Break before Make" state should be much shorter compared to the length of the beam current pulses in order to prevent the emitter 11 from emitting a beam current $I_E$ due to a discharging of parasitic capacitance Cp by $I_S$ during this period.

During time period t4, the first switch S1 is switched into the ON-state to apply the adjusted first voltage $U_A=U_{E0}$ between the emitter 11 and the extracting electrode 19. This switches the beam current $I_E$ on for a first beam current pulse. Due to the calibration, the first voltage $U_A$ is equal to the required emitter voltage $U_{E0}$, and the emitted beam current $I_E$ is close or equal to the predetermined beam current $I_{E0}$. Further, the rise time of the beam current pulse is short due to the voltage control.

During time period t5, the first switch S1 becomes switched into the OFF-state to avoid a short between the first voltage source 13 and the second voltage source 15 ("Break before Make").

During time period t6, the second switch S2 is switched into the ON-state again to switch off the beam current $I_E$ to end the first beam current pulse.

The sequence of time periods t7, t8, t9 and t10 is a repetition of the sequence t3, t4, t5 and t6 to generate a second calibrated beam current pulse. These sequences can be repeated as often as needed and as long as the emitted beam current $I_E$ is within a given specification. Once the beam current $I_E$ begins to deviate beyond the specification, a new calibration sequence with the t1 and t2 periods is carried out to adjust the first voltage $U_A$ anew.

Figure 2A:
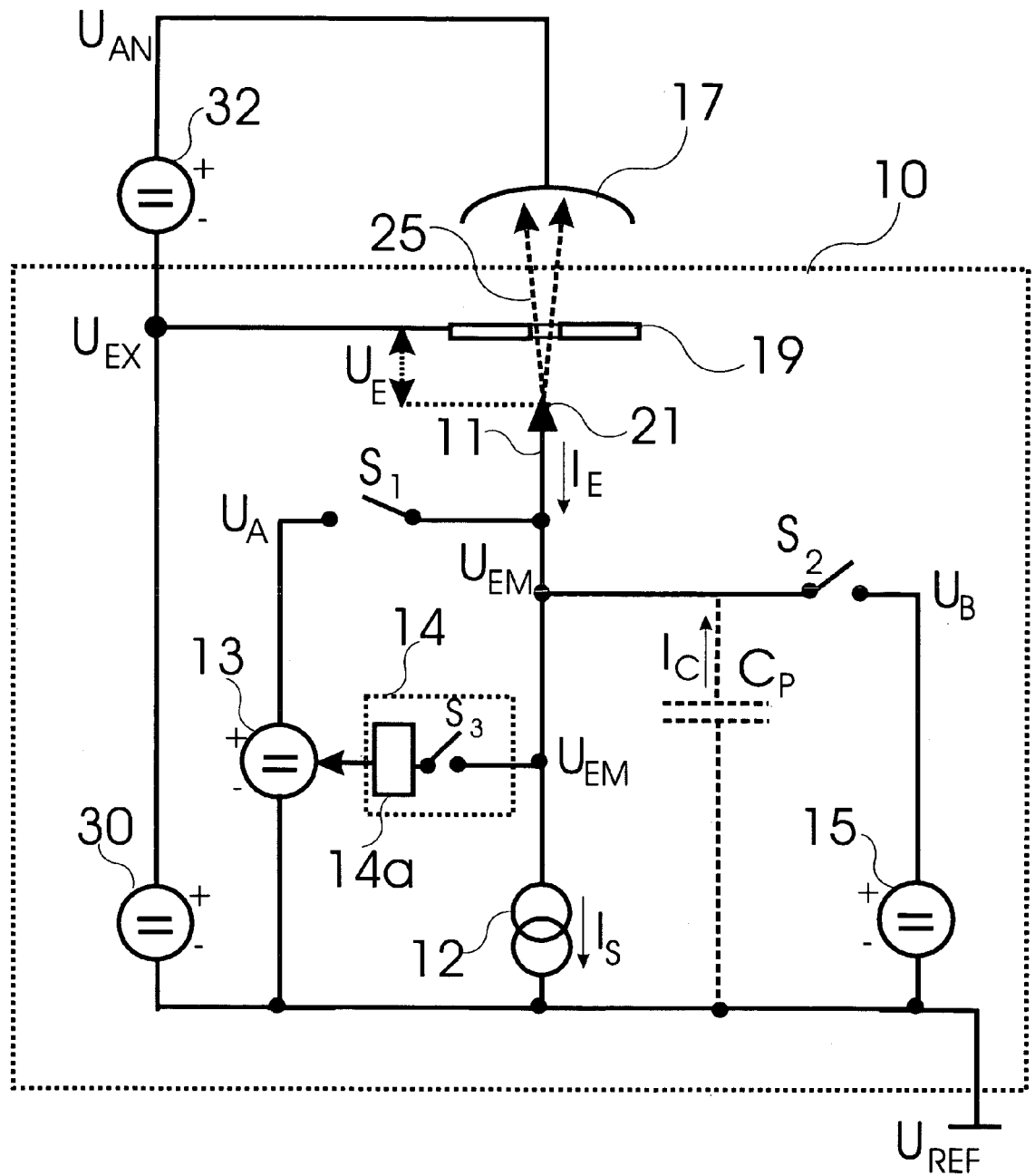
FIG. 2a shows a second field emitter beam source according to the invention with a voltage control unit to control the first voltage source.

FIG. 2a shows a second field emitter beam source 10 similar to the one shown in FIG. 1. The main difference to the field emitter beam source of FIG. 1 is the use of a voltage control unit 14 which is meant to measure and store a measured emitter voltage $U_{EM}$ and to adjust the first voltage $U_A$ according to the measured emitter voltage $U_{EM}$. The voltage control unit 14 comprises a third switch S3 and a storing unit 14a. The third switch S3 determines at what time the voltage at the emitter 11 is electrically connected with the storing unit 14a (S3 in ON-state) and at what time it is disconnected from the storing unit (S3 in OFF-state). When the storing unit 14a is disconnected, the last analogue voltage value measured at the emitter 11 before disconnection is stored in the storing unit 14a. The stored analogue voltage value represents the measured emitter voltage $U_{EM}$. Once the third switch S3 is switched back into the ON-state, the stored measured emitter voltage $U_{EM}$ becomes overwritten by the new analogue values from the emitter 11.

The storing unit 14a of FIG. 2a is connected with the first voltage source 13 to adjust the first voltage $U_A$ to the measured emitter voltage $U_{EM}$. In this way, the voltage control unit 14 can perform the measurement of the emitter voltage $U_E$ and the adjustment of first voltage $U_A$ to the measured emitter voltage $U_{EM}$ by activating the third switch S3.

Figure 2B:
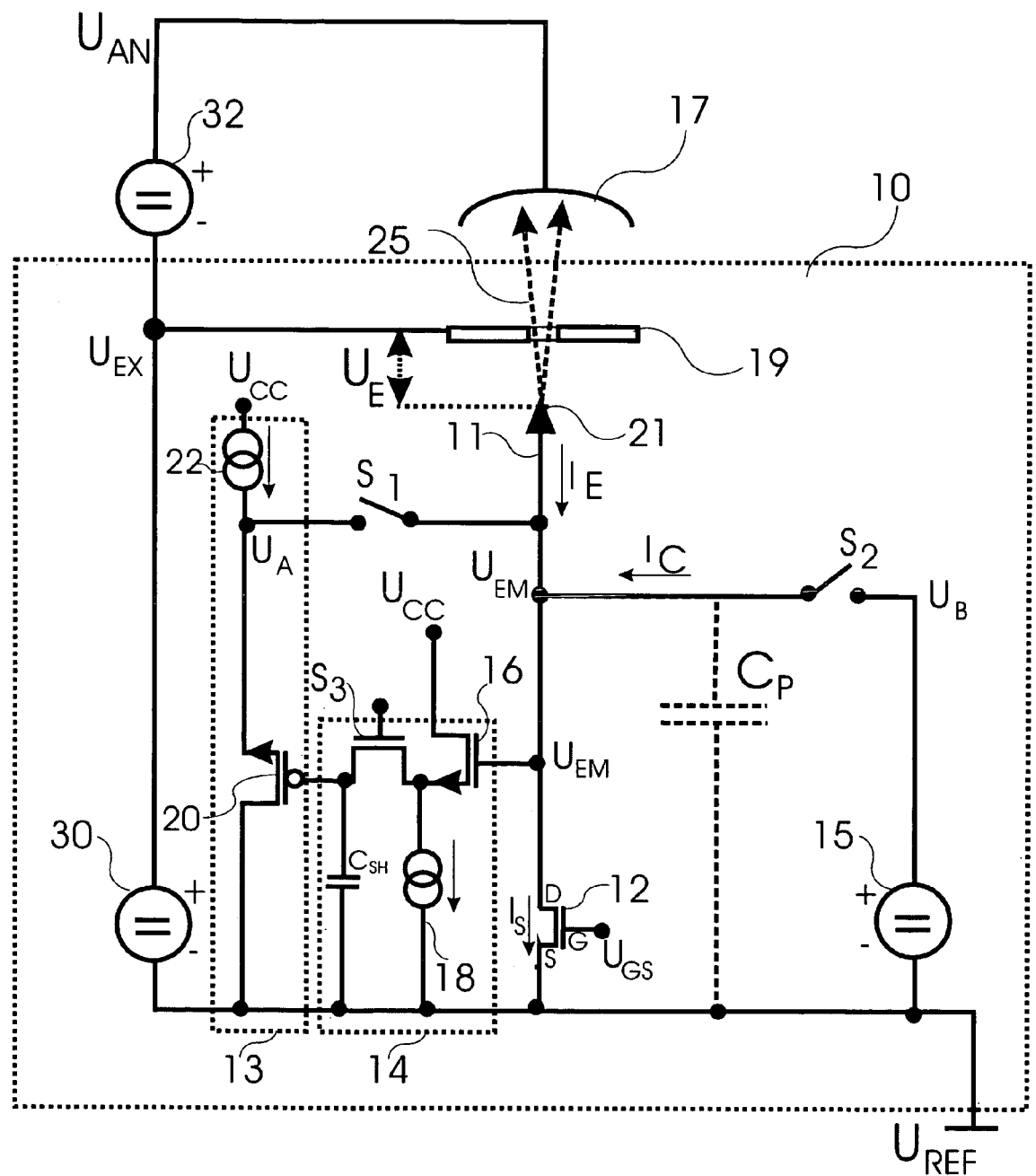
FIG. 2b shows the second field emitter beam source with the voltage control unit in more detail.

FIG. 2b illustrates in more detail a non-limiting example of how the voltage control unit 14, the first voltage source 13 and the current source 12 of the field emitter beam source 10 of FIG. 2a can be realized.

In FIG. 2b, the current source 12 of FIG. 2a is realized by an n-channel MOS-FET where the drain D is connected with the emitter 21 and the source S is connected with the reference voltage $U_{REF}$. The current $I_S$ of the current source 12 is controlled by a voltage $U_{GS}$ applied to the gate G of the n-channel MOS-FET. The current source of FIG. 2b is only a simple and space-saving example of a current source design, and other designs of a current source can be used as well.

The first voltage source 13 in FIG. 2b is realized by a first MOS-FET source follower comprising a p-channel MOS-FET 20 with its source connected with a further current source 22. The source follower is used to convert a high impedance voltage at the gate of the MOS-FET 20, i.e. an input voltage $U_{in}$, into a low impedance voltage, i.e. the first voltage $U_A$, at the source of the MOS-FET 20 to provide the first voltage $U_A$ at the emitter 11.

The voltage control unit 14 is electrically connected with the first voltage source 13 to adjust the first voltage $U_A$ according to the measured voltage $U_{EM}$. The voltage control unit 14 in FIG. 2b is realized by a circuit comprising a second source follower having an n-channel MOS-FET 16. The source of the n-channel MOS-FET 16 is connected with a still further current source 18, and the drain is connected with a voltage supply $U_{CC}$. The input of the second source follower is connected with the emitter 11 to sense the emitter voltage $U_E$. The source of the second source follower is further connected with the input of the third switch S3 which is realized by a further MOS-FET. The output of the third switch S3 is connected with a sampling capacitance $C_{SH}$ and the input of the first voltage source 13, i.e. the gate of p-channel MOSFET.

The voltage control unit 14 adjusts the first voltage $U_A$ in the following way: in a first step, the n-channel MOS-FET source follower senses the emitter voltage $U_E$ by converting the high impedance of the measured emitter voltage $U_{EM}$ at the emitter 11 to a low impedance signal a the source. This way, the measured emitter voltage $U_{EM}$ can be measured without having to load the current source 12 significantly.

The source voltage $U_{sv}$ at the source of the n-channel MOS-FET 16 is essentially given by:

$$U_{sv}=U_{EM}-(U_{Tn}+\delta_n)$$

where $U_{Tn}$ is the threshold voltage and $\delta_n$ is the over-drive voltage of the n-channel MOSFET. If the third switch S3 is switched on, the source voltage $U_{sv}$ is connected with the storing capacitance $C_{SH}$ to store a sample and hold charge $Q_{SH}$ corresponding to the source voltage $U_{sv}$. If the third switch S3 switched off again, the sample and hold charge $Q_{SH}$ can be stored for about a second at room temperature.

With the source voltage $U_{sv}$ on the storing capacitance $C_{SH}$, the p-channel MOSFET generates a first voltage $U_A$ at the source of the p-channel MOSFET:

$$U_A=U_{EM}-(U_{Tn}+\delta_n)+(|U_{Tp}+\delta_p|)$$

where $U_{Tp}$ is the threshold voltage and $\delta_p$ is the over-drive voltage of the p-channel MOSFET. Since threshold voltages and over-drive voltages can be adjusted through the choice of transistor layout and the currents of the respective current sources, $(U_{Tn}+\delta_n)$ and $(|U_{Tp}+\delta_p|)$ can be chosen to be equal independent of their respective input voltages. In this case, it holds $$U_A=U_{EM}$$

The third switch S3 used to connect the source with or disconnect the source from the sampling capacitance $C_{SH}$ to store the source voltage $U_{sv}$. This way, the third switch S3 can be used to determine the time at which the source voltage $U_{sv}$ is stored on the sampling capacitance $C_{SH}$. The third switch S3, preferably, is an n-channel MOS-FET which is switched on by applying a positive voltage to the gate, and which is switched off by applying a more negative voltage to the gate. If the third switch S3 is switched on, the source voltage $U_{sv}$ is applied to the storing capacitance $C_{SH}$. If the third switch S3 is switched off again, the source voltage $U_{sv}$ remains stored since the charge on the sample capacitor cannot flow away.

Therefore, to a good approximation, the voltage control unit 14 controls the first voltage source 13 in a way which ensures that the first voltage $U_A$ is equal to the measured emitter voltage $U_{EM}$. This way, the voltage control unit 14 can be used to measure a voltage at the emitter 11 to obtain a measured emitter voltage $U_{EM}$ which equals the required emitter voltage $U_{E0}$. The voltage control unit 14 is further capable of making the first voltage source 13 adjust the first voltage $U_A$ to the required emitter voltage $U_{E0}$. This way, the field emitter beam source 10 can use the voltage source 13 to provide the required emitter voltage $U_{E0}$ necessary to generate the predetermined beam current $I_{E0}$.

The basic idea of the voltage control unit 14 and the first voltage source 13 in this embodiment is that the voltage drop $|U_{Tn}+\delta_n|$ of the n-channel source follower whose output is connected with the input of an p-channel source follower is compensated by the voltage drop $|U_{Tp}+\delta_p|$ of the p-channel source follower. It is therefore obvious for a person skilled in the art that the same effect is obtained when the voltage control unit 14 comprises a p-channel source follower whose output is connected with the input of an n-channel source follower of the first voltage source 13. This way, the voltage drop $|U_{Tp}+\square_p|$ of the p-channel source follower of the voltage control unit 14 is compensated by the voltage drop $|U_{Tn}+\delta_n|$ of the n-channel source follower of the first voltage source 13.

Figures 2C, 2D:
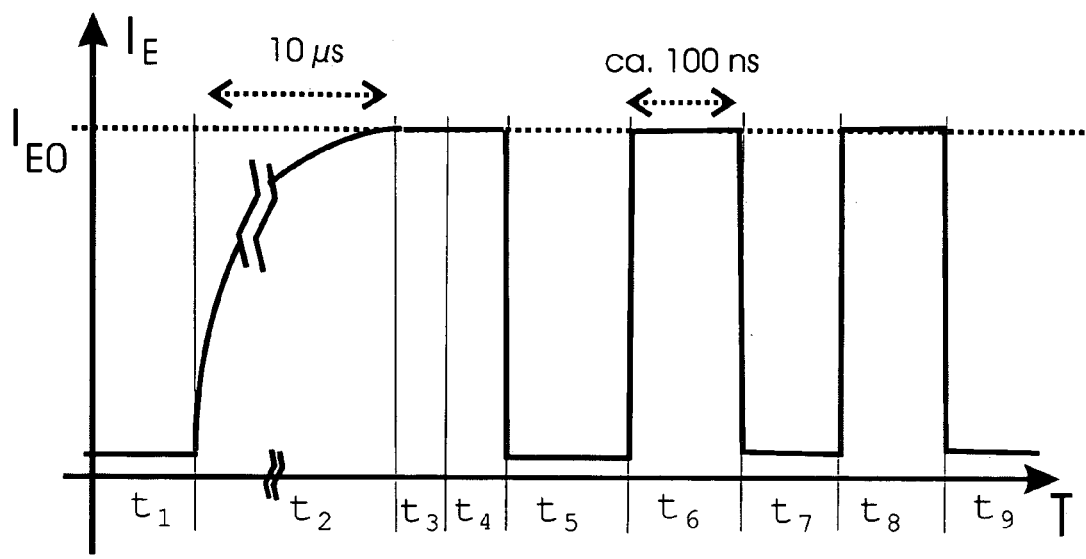
FIG. 2c shows a time diagram of a short beam current pulse sequence generated by the field emitter beam source of FIG. 2b.
FIG. 2d shows a table with the logical states of the switches S1, S2 and S3 used to generate the beam current pulse sequence of FIG. 2c.

FIG. 2c, for demonstrational purposes, discloses a beam current pulse sequence generated by the field emitter beam source of FIG. 2b. FIG. 2d discloses the corresponding sequence of the status of the first switch S1, the second switch S2 and the third switch S3 for generating the beam current pulse sequence.

During time period t1, the beam current pulse is switched off by applying a second voltage $U_B$ to the emitter 11 (second switch S2 in ON-state). At the same time, the first voltage $U_A$ is disconnected from the emitter 11 (first switch S1 in OFF-state). The status of the third switch S3 is of no relevance at that time (third switch S3 in X-state).

During time period t2, the first switch S1, the second switch S2 and the third switch S3 are disconnected in order to provide the predetermined beam current $I_{E0}$ for the emitter 11. However, it takes some time (10 μs or more in this example) until the current $I_s$ generated by the current source 12 is equal to the predetermined beam current $I_{E0}$ emitted into free space by the emitter 11. This is because the emitter voltage $U_E$ of the emitter 11 needs some time to adjust itself to the required emitter voltage $U_{E0}$ necessary for the emission of the predetermined beam current $I_{E0}$. The time for the adjustment of the emitter voltage $U_E$ is limited by the size of the parasitic capacitance Cp of the emitter that needs to be loaded with the required emitter voltage $U_{E0}$. In a typical case for a field emitter beam source fabricated with micromechanical processing technology, the parasitic capacitance Cp is as low as 10 fF; the current provided by the current source is typically 10 nA and the voltage difference ΔV between the second voltage $U_B$ and required emitter voltage $U_{E0}$ is 5 V. In this case, the rise time of the emitter voltage $U_E$ is $\Delta t=\Delta V \times I_{E0}/Cp=5$ μs. Therefore, it takes as least 10 μs until the emitter voltage $U_E$ has adjusted itself to the required emitter voltage $U_{E0}$ needed to generate an electron beam 25 having the predetermined beam current $I_{E0}$. The slow rise time of the beam current $I_E$ when the current source 12 is used to generate a beam current pulse is indicated by the long time period t2 on the time axis in FIG. 2c.

During time period t3, the third switch S3 is brought into the ON-state in order for the voltage control unit 14 to measure the required emitter voltage $U_{E0}$ at the emitter 11. With the third switch S3 switched on, a source voltage $U_{sv}=U_{E0}-|U_{Tn}+\delta_n|$ is stored on the storing capacitance $C_{SH}$, and the first voltage source 13 outputs a first voltage $U_A=U_{E0}-|U_{Tn}+\delta_n|+|U_{Tp}+\delta_p|=U_{E0}$.

During time period t4, the third switch S3 is switched off again to store the measured emitter voltage $U_{EM}$ on the sampling capacitance $C_{SH}$ to keep the value of the first voltage $U_A$ at a constant required emitter voltage $U_{E0}$.

During time period t5, the second switch S2 is switched on in order to switch off the beam current $I_E$. Now the calibration of the first voltage $U_A$ is finished, and a sequence of beam current pulses with fast rise and fall times, each beam current pulse having a predetermined beam current $I_{E0}$, can be started.

During time period t6, the first switch S1 is switched on in order to switch on the beam current $I_E$ again. The beam current $I_E$ is equal to the predetermined beam current $I_{E0}$ since the first voltage $U_A$ has been calibrated to be equal with the required emitter voltage $U_{E0}$. The rise time $\Delta T_R$ of the beam current pulse is limited by the output resistance $R_{o1}$ of the first voltage source 13 and the resistance $R_{S1}$ of the first switch S1 in the ON-state through the relation $\Delta T_R=(R_{o1}+R_{S1})$ Cp. With a sufficiently low output resistance $R_{o1}$ and ON-resistance $R_{S1}$, the rise time $\Delta T_R$ can be made well below 1 ns. Just before the beam current pulse is to be switched off, the first switch S1 is switched off again in order to "break" the connection of the first voltage source 13 with the emitter 11 before a connection is made with the second voltage source 15 ("Break before Make"). This is to avoid a short between the first voltage source 13 and the second voltage source 15 during switch off.

During time period t7, the second switch S2 is switched on in order to switch off the beam current $I_E$. Like the rise time, the fall time $\Delta T_F$ of the beam current pulse is limited by the output resistance $R_{o2}$ of the second voltage source 15 and the resistance $R_{S2}$ of the second switch S2 during the ON-state, i.e. $\Delta T_F=(R_{o2}+R_{S2})$ Cp, and is well below 1 ns. Just before the beam current pulse is to be switched on for a new pulse, the second switch S2 is switched off again in order to "break" the connection of the second voltage source 15 with the emitter 11 before a new connection is made with the first voltage source 13 ("Break before Make"). Due to the short rise time $\Delta T_R$ and fall time $\Delta T_F$, the pulse length of the beam current pulses can be made short, e.g. much shorter than 100 ns, and the timing of the beam current pulses can be freely controlled by the timing of the first switch S1 and the second switch S2.

The time periods t8 and t9 represent a repetition of the time periods t6 and t7 to generate a new beam current pulse where the beam current $I_E$ is controlled by the first voltage source 13, and the pulse length by the times at which the first switch S1 and the second switch S2 are switched on and off. The series of the voltage controlled beam current pulses can be arbitrarily extended by repeating the time periods t6 and t7.

Figure 2E:
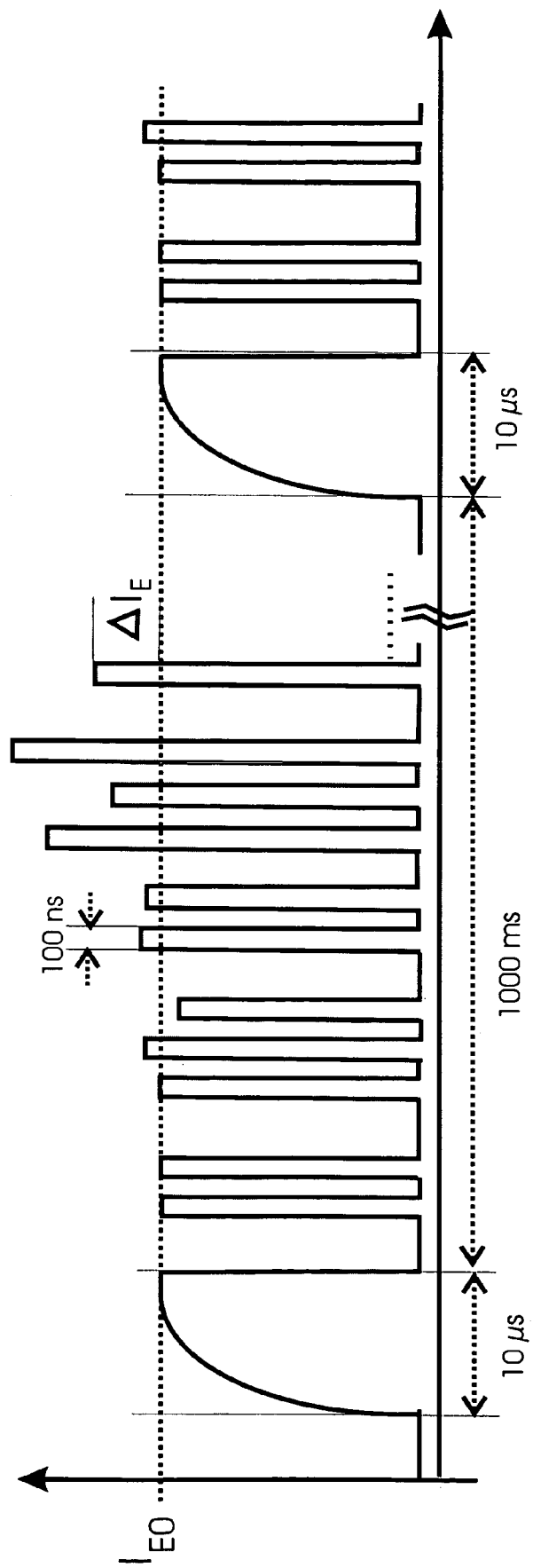
FIG. 2e shows a time diagram of a long beam current pulse sequence generated by the field emitter beam source of FIG. 2b.

FIG. 2e illustrates an extended sequence of beam current pulse emitters by the emitter 11. In this case, the calibration of the first voltage $U_A$ is repeated every 1000 ms in order to assure that the emitted electron beam pulses have a beam current $I_E$ close or equal to the predetermined beam current $I_{E0}$. The calibration is repeated because the characteristic voltage-current (V-I) curve of the field emitter beam source may have changed over time due to e.g. contamination or deformation of the emitter 11 or extracting electrode 19. In particular, if the vacuum in which the field emitter beam source 10 is operated is poor, the contamination rate of the emitter 11 or extracting electrode 19 may be so high that a frequent calibration of the first voltage $U_A$ is necessary to provide a predetermined beam current $I_{E0}$.

FIG. 2e illustrates the case where it is the goal to generate a sequence of beam current pulses where each beam current pulse emitted has the same beam current pulse charge Q. This is a frequent requirement for electron beam devices where the electron beam is scanned over a specimen, and each spot of a specimen that is to be irradiated by the electron beam is to be exposed to the same charge. The exposure of the specimen to the same charge is achieved by (a) calibrating the field emitter beam source at time intervals of 1000 ms to generate a predetermined beam current $I_{E0}$, and (b) between calibrations, alternately switching the first switch S1 and the second switch S2 at constant time intervals to ensure that the pulses have the same pulse length. In FIG. 2e, the pulse length of each pulse is 100 ns, i.e. the beam current pulse charge Q of each pulse is Q=100 ns×10 nA=1 fCb. Note that in FIG. 2e, the distances between neighboring beam current pulses are changing since not every spot but only selected spots on the specimen are meant to be irradiated to generate a pattern.

However, while the timing of the beam current pulse lengths can be controlled well, FIG. 2e also illustrates how the beam current $I_E$ begins to erratically deviate from the predetermined beam current $I_{E0}$ by beam current differences $\Delta I_E$ with increasing time from the time of calibration. The beam current differences $\Delta I_E$ of course change the beam current pulse charge Q of the beam current pulses which is why, in this example, a repetition of the calibration cycle every 1000 ms is necessary. The calibration rate, however, may be much higher or lower, depending on the requirements for the stability of the beam current pulse charge Q, depending on the quality of the vacuum or depending on the material and type of the emitter 11 or extracting electrode 19, etc.

Figure 3A:
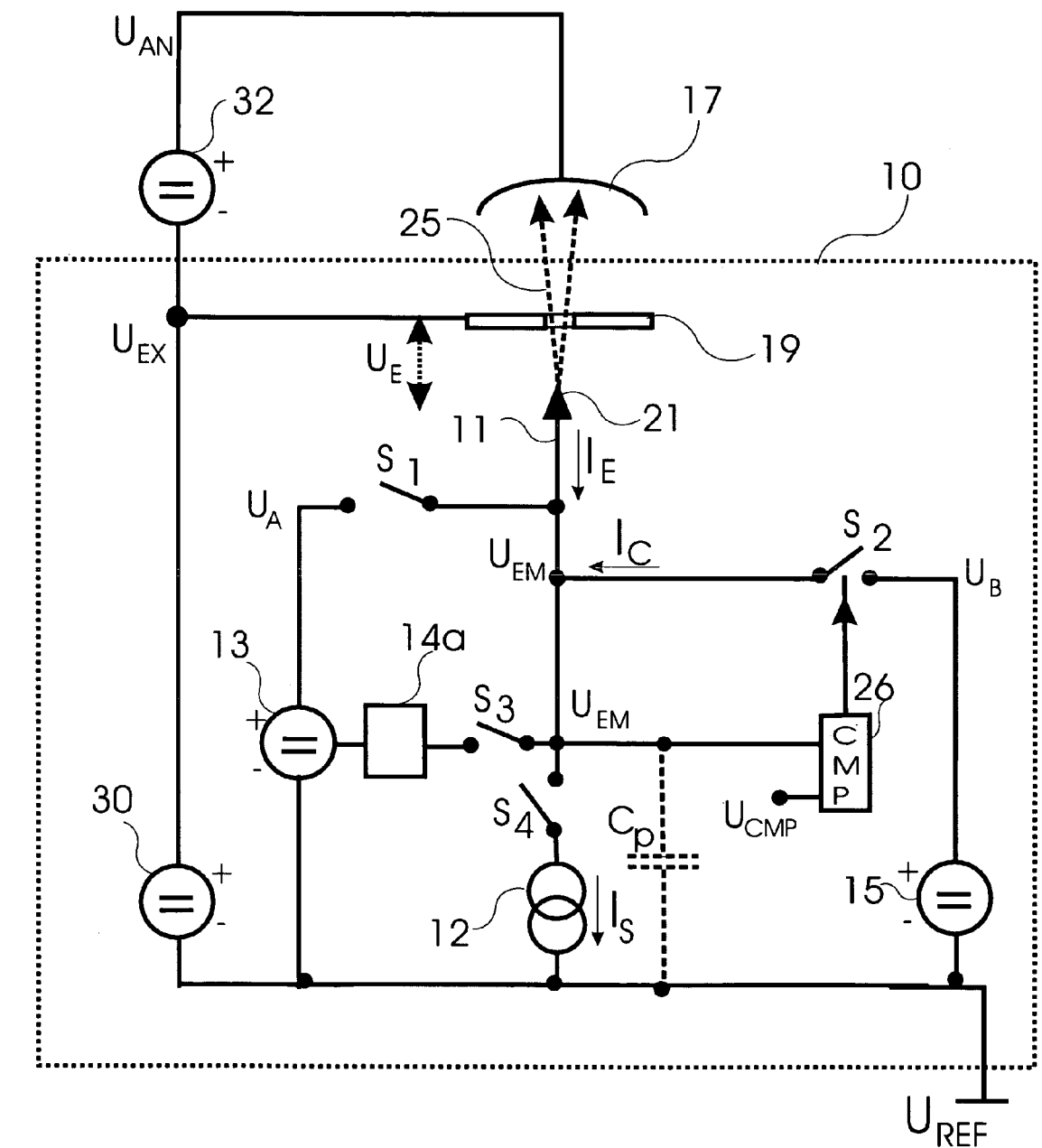
FIG. 3a shows a third field emitter beam source according to the invention with a voltage control unit and charge control means to control the charge of the beam current pulses.

FIG. 3a illustrates another field emitter beam source 10 according to the invention which differs from the one shown in FIG. 2a by the additional charge control means comprising a fourth switch S4 and a comparator 26. The fourth switch S4 serves to connect or disconnect the emitter 11 from the current source 12. With the current source 12 disconnected from the emitter 11, the comparator 26 is used to connect the second voltage $U_B$ with the emitter 11 when the emitter voltage $U_E$ has dropped below a value given by the predetermined comparison voltage $U_{CMP}$. In other words, the comparator 26 disrupts a beam current pulse at the moment when a predetermined charge Q has been emitted to a degree where the emitter voltage $U_E$ has dropped below the comparison voltage $U_{CMP}$. This way, it is possible to generate beam current pulses of equal beam current pulse charge Q, independent of the beam current $I_E$ of each pulse.

Figure 3B:
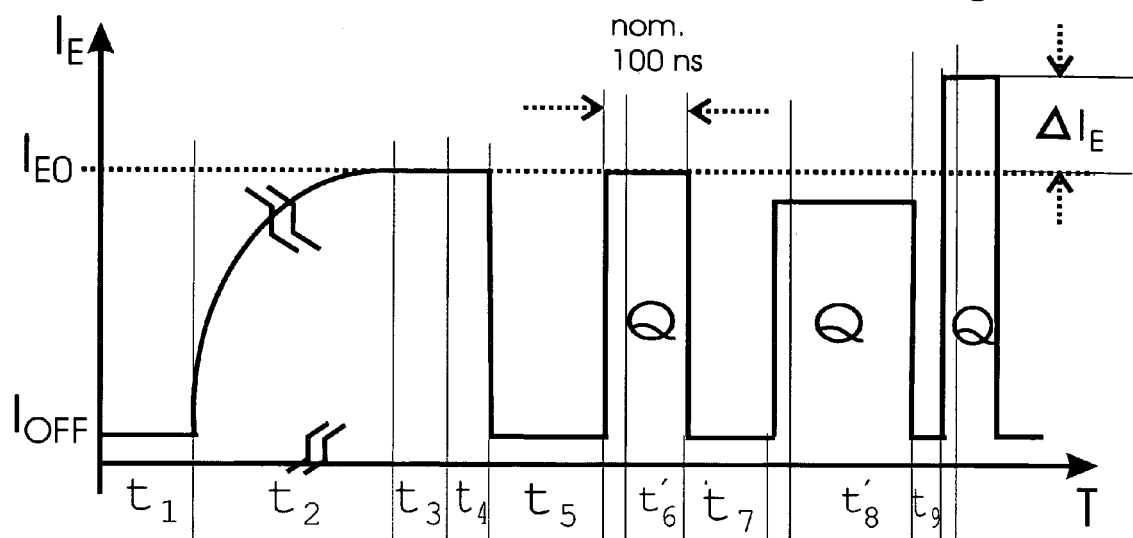
Figure 3C:
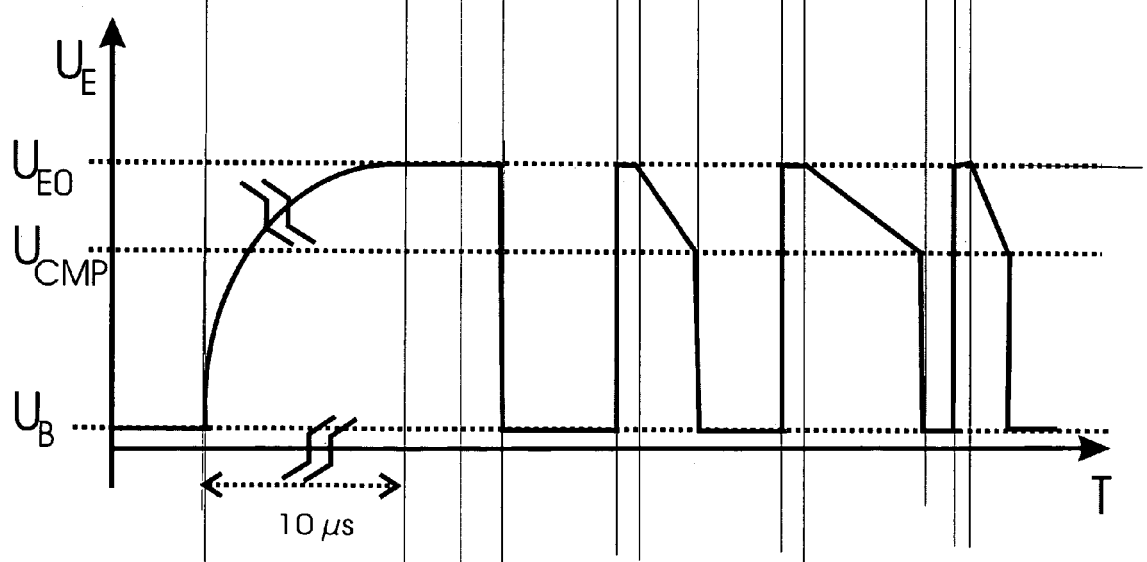
FIG. 3c shows a time diagram of the emitter voltage $U_E$ in phase with the time diagram of FIG. 3b.

FIGS. 3b, 3c and 3d illustrate how the field emitter beam source of FIG. 3a is used to generate a sequence of beam current pulses having the same beam current pulse charge Q. FIG. 3b shows the beam current $I_E$ and FIG. 3c the emitter voltage $U_E$ as a function of the time T. FIG. 3d illustrates the corresponding switching sequence of the first, second, third and fourth switch S1, S2, S3 and S4 during the time periods from t1 to t9.

In FIGS. 3b and 3c, the beam current pulse sequence starts off from the situation where, like during the time period t1 in FIG. 2c, the beam current $I_E$ is switched off. During this time, the first switch S1 is in the OFF-state and the second switch S2 in the ON-state to provide a second voltage $U_B$ between emitter 11 and extracting electrode 19.

During time period t2, the first beam current pulse begins in the same way as the calibration pulse of FIG. 2c during the time period t2. During this time, the field emitter beam source 10 is operated in the current control mode, i.e. the first switch S1 and the second switch S2 are in the OFF-state in order to disconnect the first voltage source 13 and the second voltage source 15 from the emitter 11. At the same time, the fourth switch S4 is in the ON-state to provide a predetermined beam current $I_{E0}$ for the emitter 11. Like in FIG. 2c, the rise time $\Delta T_R$ of the beam current pulse is long due to the parasitic capacitance Cp and the limited beam current $I_E$. After about 10 µs, the beam current $I_E$ has reached the predetermined beam current $I_{E0}$, which in FIG. 3b is again 10 nA (FIG. 3b), and the emitter voltage $U_E$ has reached the required emitter voltage $U_{E0}$ (FIG. 3c).

During time period t3, the required voltage $U_{E0}$ is measured by means of the voltage control unit 14, and the first voltage $U_A$ is adjusted to the required emitter voltage $U_{E0}$, i.e. $U_A=U_{E0}$. The method by which the measurement and the adjustment is carried out has already been described in the description of FIGS. 2c and 2d.

During time period t4 and from that time on, the fourth switch S4 becomes switched into the OFF-state in order to disconnect the current source 12 from the emitter 11.

During time period t5, the second switch S2 is switched into the ON-state to switch off the beam current $I_E$. Now the field emitter beam source is in the voltage control mode, and the generation of a beam current pulse sequence under voltage control can begin.

During time period t6, the first voltage $U_A$ which has been adjusted to the required emitter voltage $U_{E0}$ is switched on for a short time by means of the first switch S1. The first voltage $U_A$ serves to provide the required emitter voltage $U_{E0}$ for the emitter 11 to discharge the parasitic capacitance Cp. The discharging needs little time, e.g. less than 10 ns, due to the low output resistance of the first voltage source 13, i.e. the charging time is much shorter than it appears in the drawing of FIG. 3c. Once the parasitic capacitance Cp has been discharged, the first switch S1 is switched into the OFF-state.

Now a second time period t6' begins during which the first voltage $U_A$, the second voltage $U_B$ and the current source 12 are disconnected from the emitter 11. In this state, the emitter 11 emits the charge from the parasitic capacitance Cp to keep emitting a current according to the characteristic voltage-current (V-I) curve of the field emitter beam source. However, while the beam current $I_E$ continues to be emitted, the emitter voltage $U_E$ drops due to the charging of the parasitic capacitance Cp by the beam current $I_E$, as shown in FIG. 3c.

The voltage drop of the emitter voltage $U_E$ is used by the comparator 26 of FIG. 3a to determine at what time to stop the beam current pulse by comparing the emitter voltage $U_E$ with a predetermined comparison voltage $U_{CMP}$. Once the emitter voltage $U_E$ has dropped below the comparison voltage $U_{CMP}$, the comparator forces the fourth switch S4 to switch into the ON-state. In the ON-state, the fourth switch S4 disconnects the beam current pulse by connecting the second voltage $U_B$ with the emitter 11. Since the voltage drop $\Delta U_{CMP} = U_{E0} - U_{CMP}$ is the same for every beam current pulse of a given field emitter beam source 10, the emitted beam current pulse charge $Q = \Delta U_{CMP}/Cp$ is the same even if the field emitter beam source 10 should change its characteristic voltage-current (V-I) curve over time. The scale for the voltage drop $\Delta U_{CMP} = U_{E0} - U_{CMP}$ in FIG. 3c, for demonstrational purposes, is drawn much larger than in reality.

For example, if a contamination of the emitter 11 changes the field emitter beam source 10 to decrease the beam current $I_E$ for a given emitter voltage $U_E$, the decrease leads to a slower charging of the parasitic capacitance Cp. The slower charging results in a longer time period after which the comparator 26 detects the required voltage drop $\Delta U_{CMP} = U_{E0} - U_{CMP}$ to switch off the beam current pulse. Accordingly, a lower beam current $I_E$ leads to a longer beam current pulse length. This can be seen in FIGS. 3b and 3c for the beam current pulse during time period t8 and t8'. In the case that the beam current $I_E$ increases for a given emitter voltage $U_E$, the opposite takes place, i.e. the beam current $I_E$ increases but the time period after which the beam current pulse is switched off is shorter. This is illustrated in FIGS. 3b and 3c for the beam current pulse after the time period t9. Therefore, while the beam current $I_E$ might differ from beam current pulse to beam current pulse, the beam current pulse charge Q remains the same for each beam current pulse.

The equation $Q = \Delta U_{CMP}/Cp$, however, is valid only if the time period t6 (or t8) is much shorter than the time period t6' (or t8'). However, this is not a problem since the discharging of the parasitic capacitance Cp by means of a voltage source can be performed within a few nanoseconds or less while the total pulse length is usually in the range of a few tens of nanoseconds.

During time period t7, the second switch S2 remains in the ON-state to keep the beam current switched off. Only at the end of the time period t7, the second switch S2 is switched into the OFF-state in order to prevent a short between the first voltage source 13 and the second voltage source 15 ("Break before Make") when a new beam current pulse is to be started.

The switching of the first and second switches S1 and S2 during the time periods t8, t8' and t9 is identical to the switching during the time periods t6, t6' and t7 to perform a new beam current pulse. Again, the switching cycle of the type t6, t6' and t7 can be repeated as often as needed.

Figure 3E:
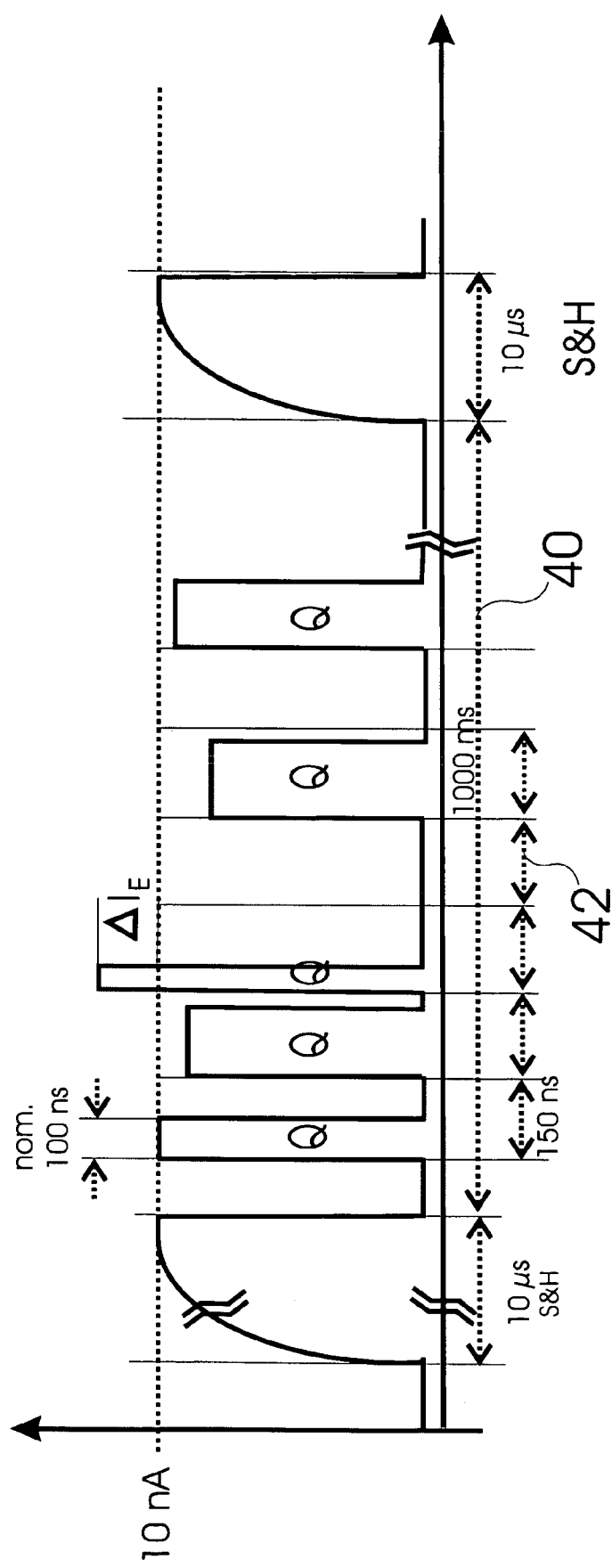

FIG. 3e illustrates an example of a beam current pulse sequence where every 1000 ms a new calibration cycle 40 begins. Between two calibration cycles, the field emitter beam source 10 of FIG. 3a is operated in the voltage mode to generate fast beam current pulses synchronized with the time scan units 42 of a length of 150 ns. A synchronization of the beam current pulses is used e.g. when the electron beam 25 is to be scanned over the surface of the specimen at equal distances to generate a well defined pattern on the specimen.

Due to the charge control means, the second switch S2 switches into the ON-state automatically; therefore, the field emitter beam source 10 only needs a trigger to switch on the first switch S1 at a rate of 1/150 ns. In addition, a trigger is needed to start the calibration every 1000 ms (S3, S4 into ON-state; S1, S2 into OFF-state, then S3 into OFF-state). With the charge control means, the beam current pulse charge Q of each pulse is the same; accordingly, the length L of each beam current pulse is inverse to the beam current $I_E$ of the pulse, i.e. $Q = I_E \times L$. The calibration is needed to make sure that the beam current $I_E$ of a beam current pulse remains large enough that the lengths of the beam current pulses do not extend beyond the time scan unit of 150 ns.

Figure 4A:
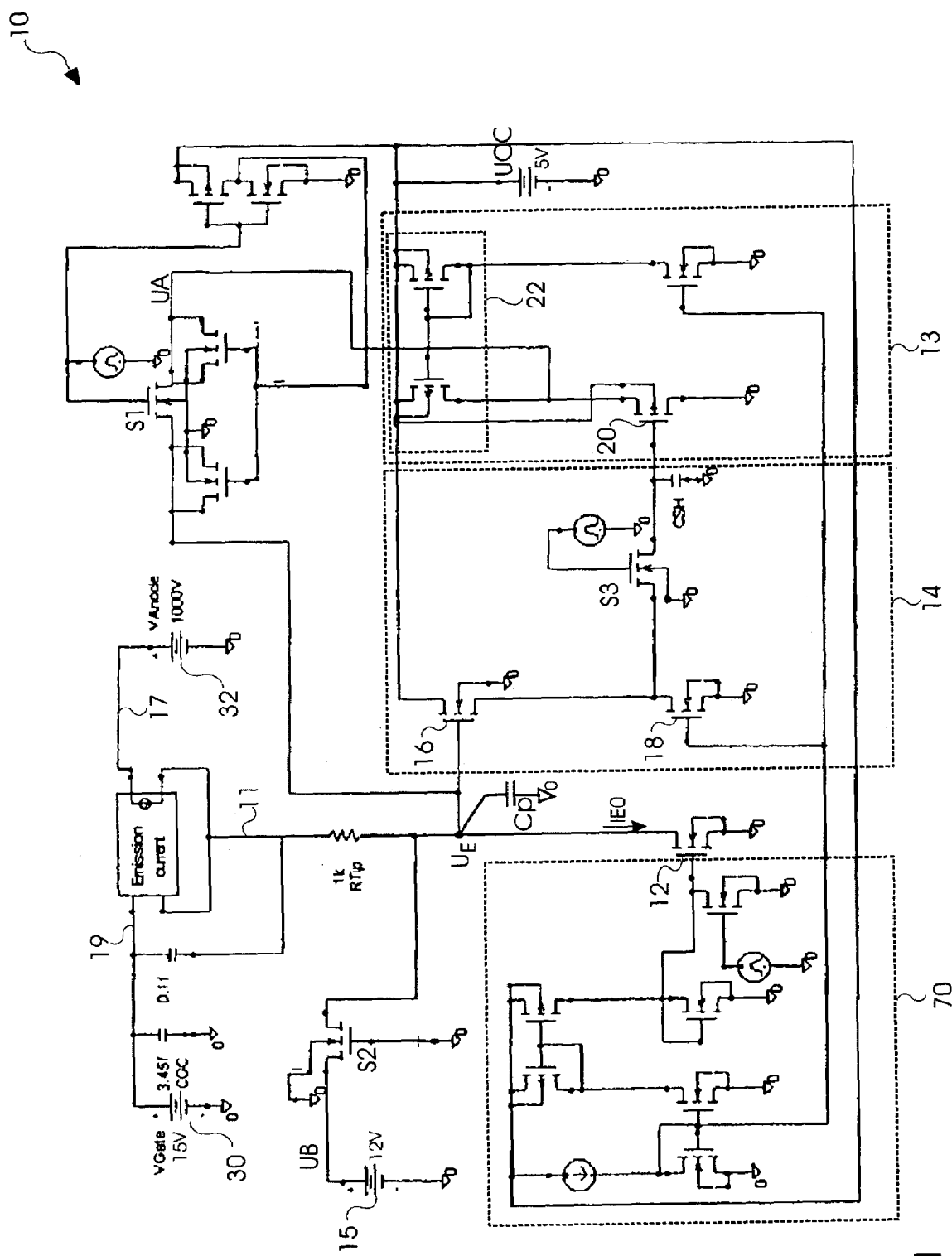
FIG. 4a shows a further field emitter beam source according to the invention with a voltage control unit.

FIG. 4a shows a further circuit of a field emitter beam source 10 according to the invention. The circuit, like the circuit of FIG. 2b, uses a voltage control unit 14 to adjust the first voltage $U_A$ to the required emitter voltage $U_{E0}$. The circuit is meant to be fabricated using CMOS technology to be integrated into a field emitter beam source cell of the size of 300 µm². This way, using CMOS technology, an array of highly integrated field emitter beam sources can be fabricated onto a semiconductor (silicon) substrate with as many as 300,000 field emitter beam sources on a 10 mm×10 mm chip.

The circuit of FIG. 4a meets all of the following specifications: (a) each field emitter beam source 10 is controlled by its own voltage control unit 14; (b) the switching voltage $\Delta V = U_{E0} - U_B$ to switch the beam current pulse on and off is smaller than 12 V; (c) the rise and fall times for each beam current pulse are smaller than 10 ns so that beam current pulses with a length as short as 100 ns can be generated with a high quality; (d) the predetermined beam current $I_{E0}$ is about 10 nA; and (e) the field emitter beam source array can have more than $10^5$ emitters per square centimeter.

The circuit of FIG. 4a comprises the voltage control unit 14 to measure the emitter voltage $U_E$ and to control the output voltage of the first voltage source 13. Like in FIG. 2b, the voltage control unit 14 comprises a first source follower having an n-channel MOS-FET 16 connected with a current source 18, a third switch S3 and a storing capacitance $C_{SH}$ to sample and hold the voltage measured at the emitter 11. At the same time, the voltage stored on the storing capacitance $C_{SH}$ adjusts the first voltage source 13 to provide a first voltage $U_A$ for the emitter 11. The first voltage $U_A$ can be applied to the emitter by switching on the first switch S1. The circuit further comprises a current source 12 which provides a predetermined beam current $I_{E0}$ for the emitter 11. The current of the current sources 12 and 18 is controlled by a current source biasing circuit 70.

FIG. 4a further discloses a second voltage source 15 providing a second voltage $U_B$ for the emitter in the case that the second switch S2 is switched into the ON-state. FIG. 4a also shows an equivalent circuit for the collector anode 17, the emitter 11 and the extracting electrode 19 (gate). In the equivalent circuit, the resistance of the emitter is assumed to be 1 kΩ, the capacitance between the extracting electrode 19 and the reference voltage "0" is assumed to be 3.45 fF, and the capacitance between the extracting electrode 19 and the emitter 11 is assumed to be 0.1 fF. Furthermore, an additional capacitance Cp exists between the node $U_{EM}$ and the reference voltage "0".

The field emitter beam source 10 of FIG. 4a further requires four independent voltage sources which act relative to a reference voltage "0": the fourth voltage source 32 (+1000 V) for the collector anode, a third voltage source 30 (+15 V) for the extracting electrode 19, the second voltage source 15 (+12V) for the second voltage $U_B$, and the voltage supply $U_{CC}$ (+5V) for the first voltage source 13, the voltage control unit 14 and the current source biasing circuit 70. When compared with the field emitter beam source 10 of FIG. 2b, these voltages translate into an anode voltage $U_{AN}$ of 985 V, a maximum emitter voltage $U_E$ of 15 V, and a second voltage $U_B$ of 3 V.

Figure 4B:
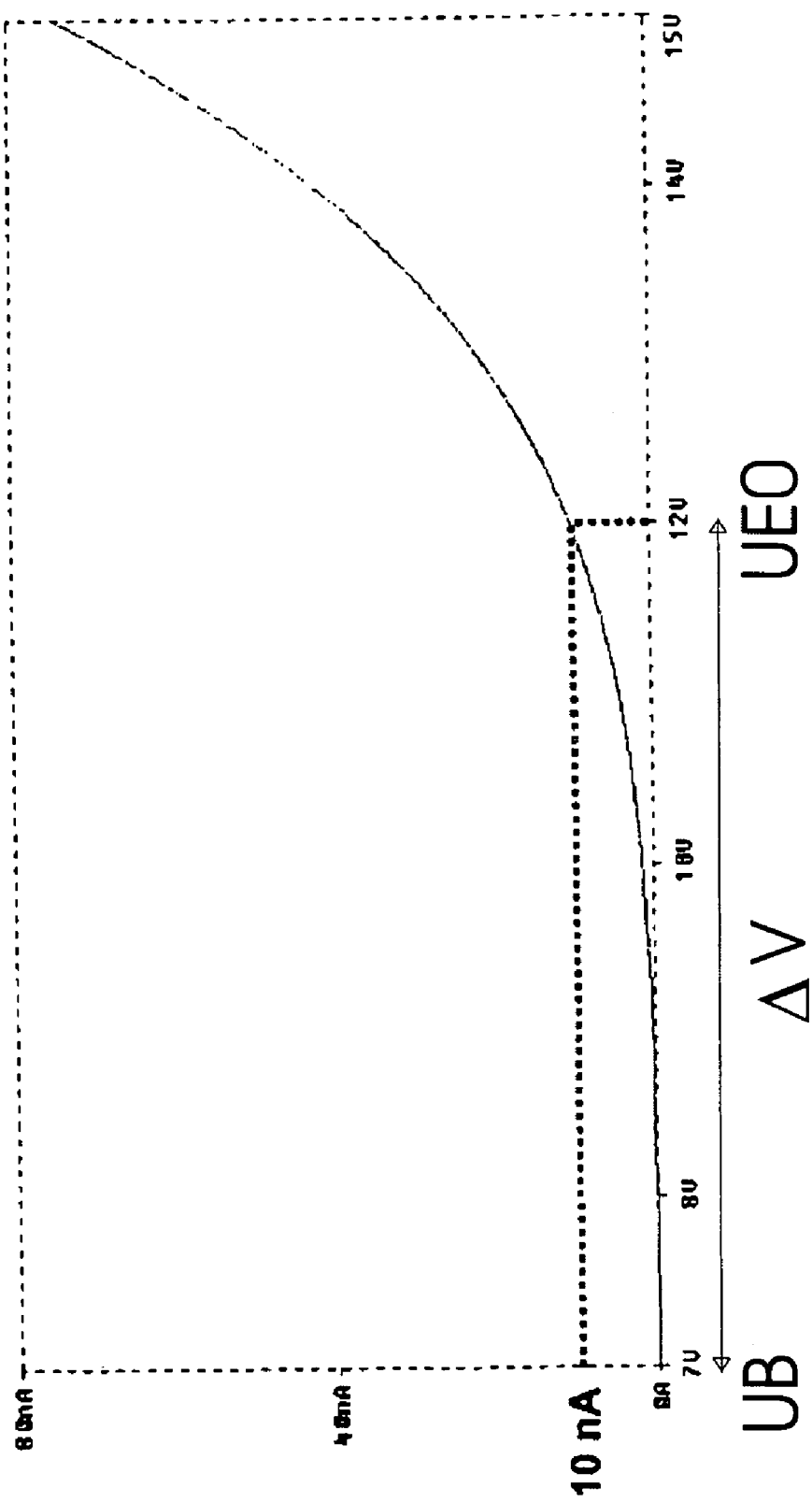

FIG. 4b shows a characteristic voltage-current (V-I) curve of the emitter-extracting electrode system of FIG. 4a. It indicates that the required emitter voltage $U_{E0}$ is 12 V, i.e. a voltage of 12 V between the emitter 11 and the extracting electrode 19 is needed to provide a beam current $I_E$ of 10 nA. FIG. 4b also indicates that the beam current $I_E$ is essentially switched off when the emitter voltage $U_E$ is smaller than 8V. Therefore, a switching voltage ΔV of about 4 V (or more) is needed at minimum to switch on and off the beam current $I_E$. The maximum beam current $I_E$ of the emitter-extracting electrode system of FIG. 4a is about 75 nA when the emitter voltage $U_E$ is at 15 V.

Figure 4C:
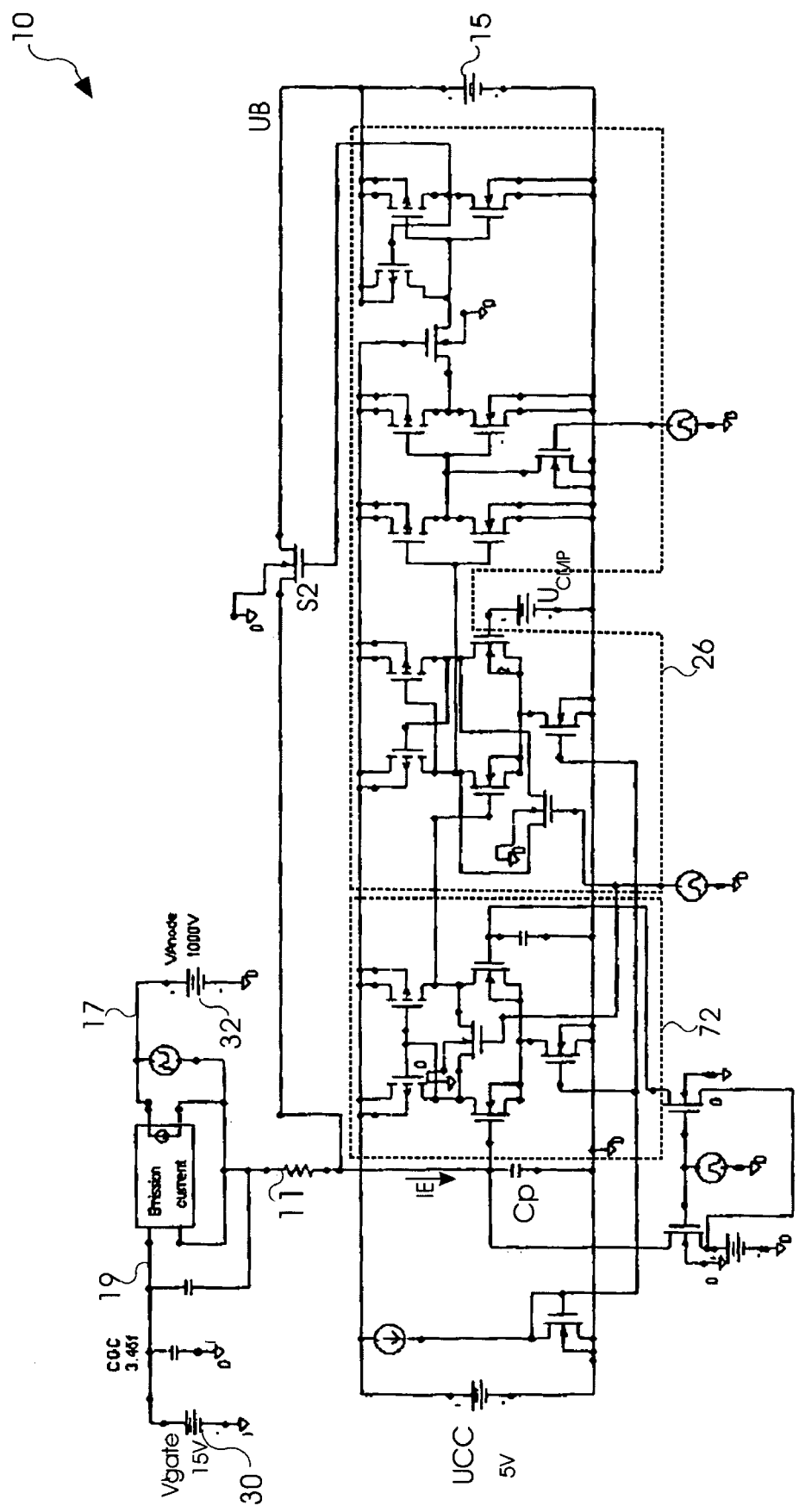
FIG. 4c shows a further field emitter beam source according to the invention using a charge control means to switch off the beam current pulse.

FIG. 4c shows a circuit of a field emitter beam source 10 with a charge control means to control the switch off time of the beam current $I_E$ according to a predetermined beam current pulse charge Q. Like in FIG. 4a, the field emitter beam source 10 comprises a collector anode at a constant voltage of +1000V, an extracting electrode 19 at a constant voltage of +15V and an emitter 11 with an emitter voltage $U_E$ depending on the mode and time of operation. In FIG. 4c, like in FIG. 4a, the capacitance between the extracting electrode 19 and the emitter 11 is 0.1 fF.

The charge control means of FIG. 4c comprise an amplifier 72 connected with the emitter 11 to amplify the voltage difference $\Delta V(t)=U_E(T=0)-U_E(T=t)$ between the emitter voltage $U_E$ at beam current pulse rise time, $U_E(T=0)$, and the emitter voltage $U_E$ at a later time $U_E(T=t)$. Once the amplified voltage difference ΔV(t) has increased above a voltage determined by the comparison voltage $U_{CMP}$, the comparator 26 switches the second switch S2 into the ON-state to connect the second voltage source 15 with the emitter. With the second voltage source 15 connected with the emitter 11, the beam current $I_E$ becomes switched off. Since the emitter voltage $U_E$ in FIG. 4c increases in proportion to the charge emitted by the emitter 11 into free space, the time for switching off the beam current $I_E$ is controlled by the beam current pulse charge Q.

The circuit of FIG. 4c requires, like in FIG. 4a, a fourth voltage source 32 (+1000 V) for the collector anode, a third voltage source 30 (+15 V) for the extracting electrode 19, a second voltage source 15 (+12V) for the second voltage $U_B$, a voltage supply $U_{CC}$ (+5V) for operating the amplifier 72 and the comparator 26. In addition, the circuit of FIG. 4c requires a voltage source for the comparison voltage $U_{CMP}$. The value of the voltage source depends on the applied charge.

Figure 5:
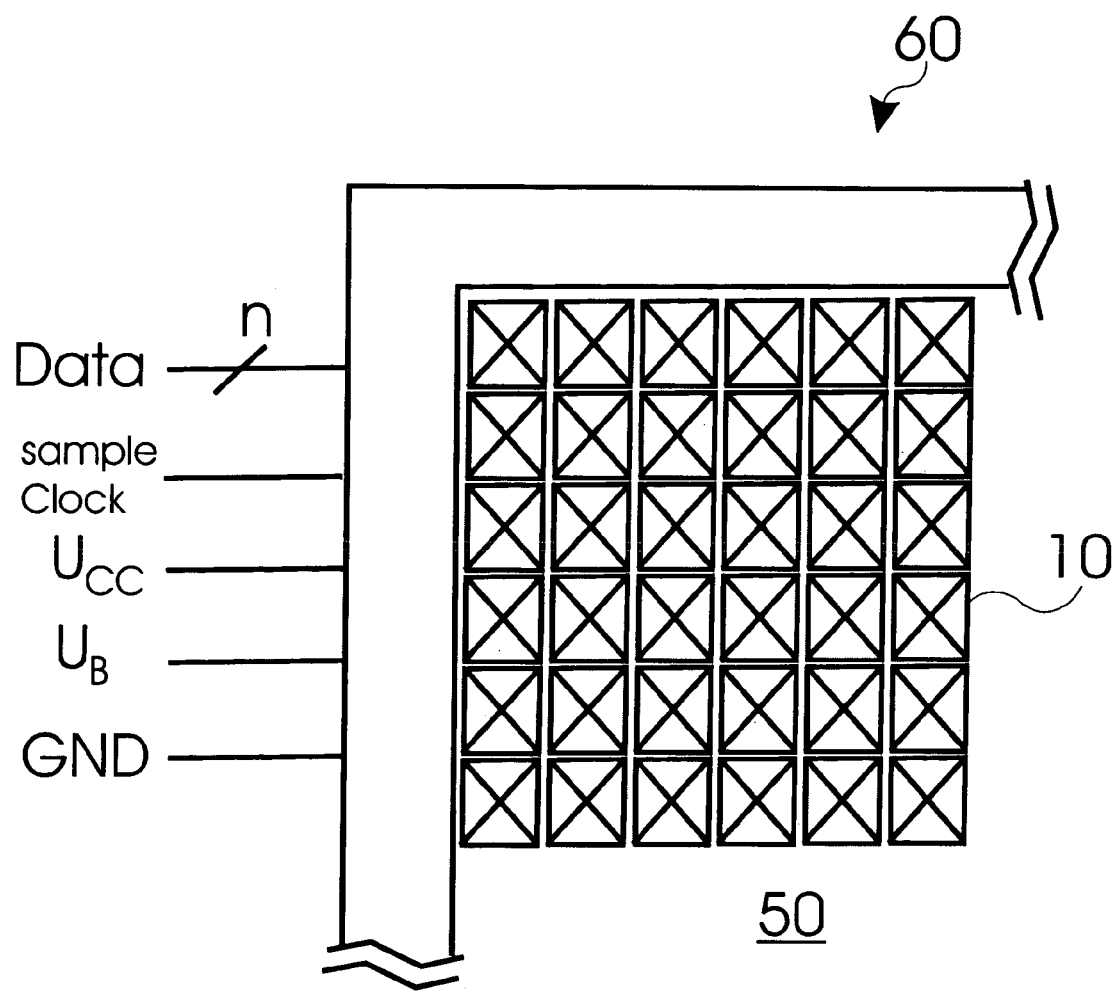
FIG. 5 schematically shows an array of field emitter beam sources according to the invention.

FIG. 5 schematically shows a field emitter beam source array 60 integrated onto a monolithic silicon substrate 50. Each cell of a field emitter beam source 10 comprises an integrated emitter 11 and an extracting electrode 19. Further, each emitter 11 of a field emitter beam source 10 is connected with a voltage control unit 14 of the type as shown in FIG. 4a. The voltage control unit 14 is integrated onto the silicon substrate 50 using CMOS-process technology using a 0.35 μm process. This allows the size of a field emitter beam source cell to be in the range of 17.5 μm×17.5 μm. With a chip size of 10 mm×10 mm, this corresponds to an array of about 300,000 field emitter beam sources. Of course, a CMOS-process with a minimum structure size smaller than 0.35 μm would further allow the number and density of the field emitter beam sources of an array to be increased.

FIG. 5 further indicates the outside connections of the field emitter beam source array 60 to control the operation of each field emitter beam source 10. For a voltage supply, a GND-line for zero volts, a line for a second voltage $U_B$ (+12V) for switching off the beam current $I_E$, and a line for a voltage supply $U_{CC}$ (+5V) are provided. Further, a sample clock line is used to control the timing of the switches, i.e. when to sample the emitter voltage $U_E$ for calibration, when to start a new beam current pulse and when to end a beam current pulse. Further, a data bus is provided to address those field emitter beam sources 10 that are to be subjected to a given sample clock signal.

It is within the scope of the invention that control of the beam current pulse charge Q can also be carried out by the comparator 26 without using a current calibration. In other words, control of the beam current pulse charge Q can be carried out with the field emitter beam source 10 of FIG. 3a without having a current source 12, a storing unit 14a, a third switch S3 and/or a fourth switch S4. This simplifies the circuit of FIG. 3a and its operation considerably. In this case, a beam current pulse is switched on by applying a first voltage $U_A$ by switching on the first switch S1 for a short time; then, after the parasitic capacitance Cp has been discharged by the first voltage $U_A$, the first switch S1 is disconnected again. As a consequence, the parasitic capacitance Cp charges up due to the beam current $I_E$ emitted by the emitter 11 until the comparator 26 senses that the emitter voltage $U_E$ has dropped to cross the comparator voltage $U_{CMP}$. At the moment when the emitter voltage $U_E$ crosses the comparator voltage $U_{CMP}$, the comparator 26 switches off the beam current pulse by switching on the second switch S2. The charge Q emitted by such beam current pulse is given by $Q=(U_A-U_{CMP})/CP$, i.e. the beam current pulse charge Q is independent of the beam current $I_E$ which therefore does not need any calibration. Instead, the beam current pulse charge Q is kept constant by an adjustment of the pulse length which determined by the comparator 26.

A field emitter beam source therefore, to provide a constant beam current pulse charge Q without a beam current calibration, requires an emitter 11, an extracting electrode 19 to extract a beam current $I_E$ from the emitter, a first voltage source 13 for providing a first voltage $U_A$ between the emitter 11 and the extracting electrode 19 to switch on the beam current $I_E$, a second voltage source 15 for providing a second voltage $U_B$ between the emitter 11 and the extracting electrode 19 to switch off the beam current $I_E$, a first switch S1 for disconnecting the first voltage $U_A$ between the emitter 11 and the extracting electrode 19, and a comparator 26 to switch off the beam current pulse once the emitter voltage $U_E$ has passed a given comparator voltage $U_{CMP}$. Preferably, the a comparator 26 switches off the beam current pulse by switching on the second switch S2 to connect the emitter 11 with the second voltage source 15, as shown in FIG. 3a.

Figure 6A:
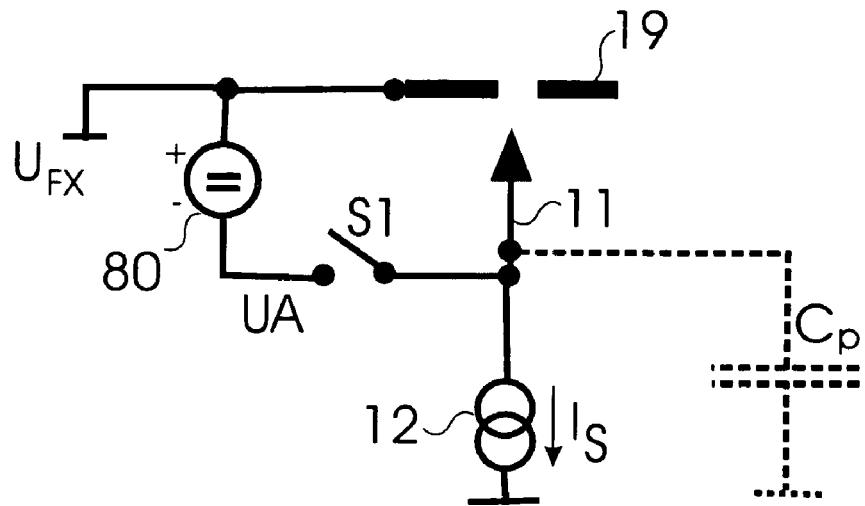
FIGS. 6a–b disclose two embodiments of a field emitter beam source according to the invention with the current source connected (a) with the emitter; and (b) with the extracting electrode.

In FIGS. 1, 2a, 2b and 3a, the first switch S1 and the current source 12 connected with the emitter 11 are connected as shown in FIG. 6a, i.e. with the first switch S1 disconnecting the emitter from the emission voltage source 80, the extracting electrode 19 is at a fixed voltage $U_{FX}$, while the voltage of the emitter 11 is free to adjust itself to a voltage required for the emission of the predetermined beam current $I_{E0}$ generated by the current source 12. In this case, the first switch S1 is positioned to connect/disconnect the emitter 11 from an emission voltage source 80 to switch on the beam current $I_E$ within a short time. The emission voltage source 80 defines the voltage between the emitter 11 and the extracting electrode when the first switch S1 is switched on. The emission voltage source 80 in FIG. 6a may stand for several voltage sources that together define the emitter voltage $U_E$ between the emitter 11 and the extracting electrode 19. For example, the emission voltage source 80 may be a combination of the first voltage source 13 and the third voltage source 30 of FIG. 1. Further, since the parasitic capacitance Cp is in parallel with the current source 12, the parasitic capacitance Cp in FIG. 6a is determined by the geometry of the emitter and the circuit.

Figure 6B:
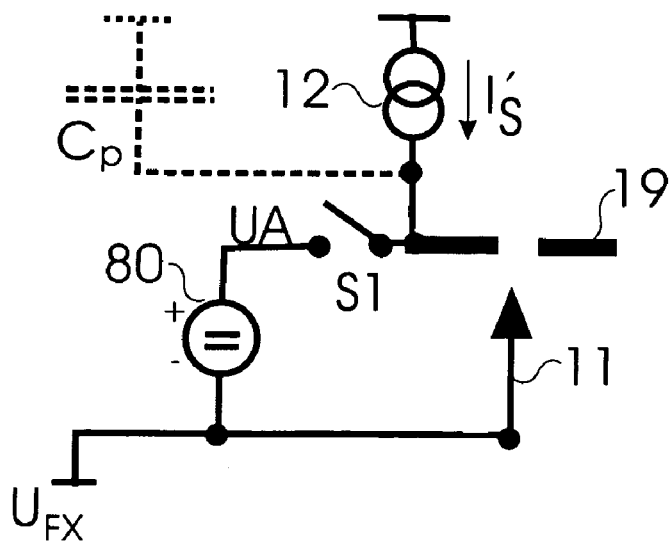

However, a person skilled in the art will realize that the present invention also includes a field emitter beam source 10 where the emitter 11 is at a fixed reference $U_{FX}$, while the voltage of the extracting electrode 19 is free to adjust itself to a voltage required for the emission of the predetermined beam current $I_{E0}$ that is generated by the current source 12. This case is shown in FIG. 6b where the current source 12 is connected with the extracting electrode 19. In FIG. 6b, the first switch S1 is positioned to connect/disconnect the extracting electrode 19 from the emission voltage source 80, e.g. to switch on the beam current $I_E$ within a short time. Since the relevant parasitic capacitance Cp is in parallel with the current source 12, the parasitic capacitance Cp in FIG. 6b is determined by the geometry of the extracting electrode 19 and the circuit.

Figure 7A:
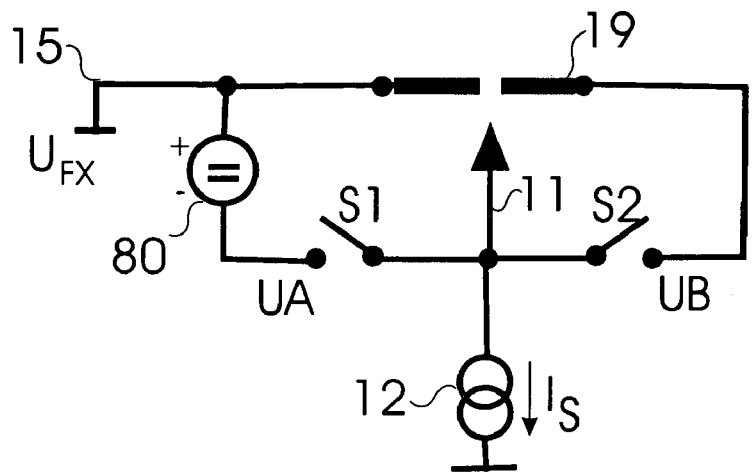
FIGS. 7a–c disclose three embodiments of a field emitter beam source according to the invention with the current source connected with the emitter and with different means to switch off the charged particle beam.
Figure 7B:
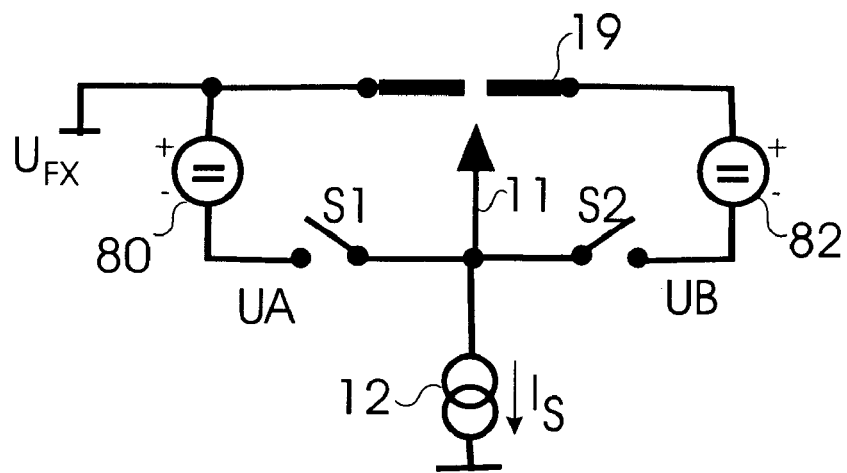
Figure 7C:
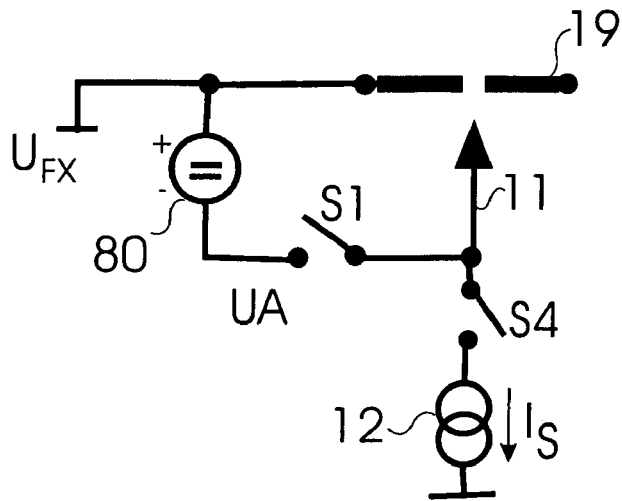

FIGS. 7a–c show different embodiments of field emitter beam source 10 according to the invention with different means to switch off the beam current $I_E$. In FIG. 7a, the beam current $I_E$ is switched off by using the second switch S2 to electrically connect the emitter 11 with the extracting electrode 19. In this case, the second voltage $U_B$ is zero volts. The advantage of this design is that no additional voltage source is needed for beam switch off.

In FIG. 7b, the beam current $I_E$ is switched off by using the second switch S2 to electrically connect/disconnect the emitter 11 with a switching-off voltage source 82. The advantage of a design with a switching-off voltage source 82 over the design of FIG. 7a is that the emitter voltage $U_E$ difference between beam current switch on and beam current switch off can be kept small. The switching-off voltage source 82 in FIG. 7b may stand for several voltage supplies that together define the emitter voltage $U_E$ between the emitter 11 and the extracting electrode 19 when the field emitter beam source is switched off. For example, the switching-off voltage source 82 may be a combination of the second voltage source 15 and third voltage source 30 of FIG. 1. The switching-off voltage source 82 in FIG. 7b reduces the switch off time and the beam current pulse height required for the switching of the beam current.

In FIG. 7c, the beam current $I_E$ is switched off by using the fourth switch S4 to disconnect the current source 12 from the emitter 11. This, too, makes a second voltage source obsolete.

Figure 8A:
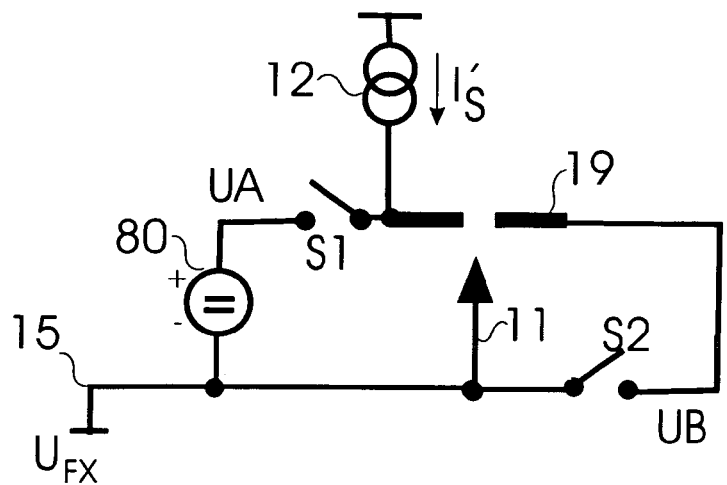
FIGS. 8a–c disclose three embodiments of a field emitter beam sources according to the invention with the current source connected with the extracting electrode and with different means to switch off the charged particle beam.
Figure 8B:
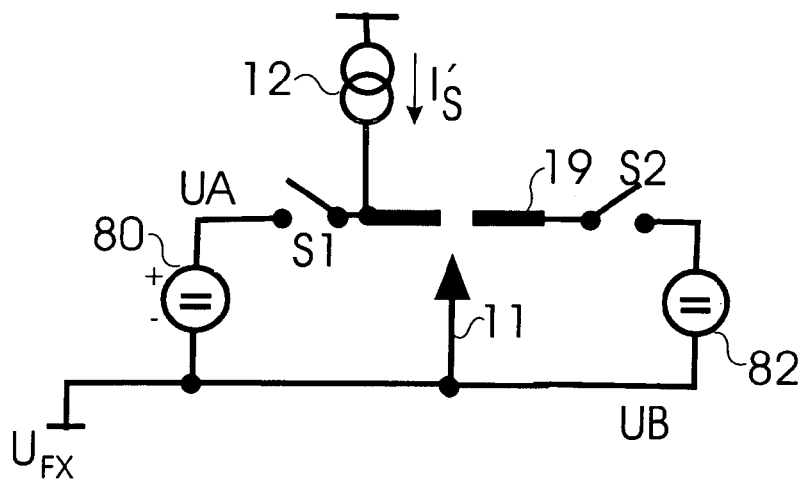
Figure 8C:
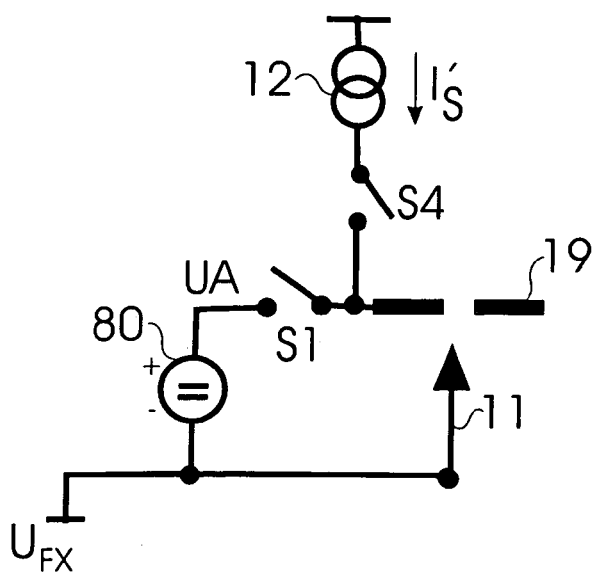

FIGS. 8a–c show embodiments of field emitter beam source 10 like in FIGS. 7a–c, with the difference that the current source 12 is connected with the extracting electrode 19 while the emitter 11 is at a fixed reference voltage $U_{REF}$ (see FIG. 6b). In this case, as shown in FIG. 8a, the beam current $I_E$ can be switched off by using the second switch S2 to electrically connect the emitter 11 with the extracting electrode 19. In this case, the second voltage $U_B$ is zero volts. The advantage of this design is that no additional voltage source is needed for beam switch off.

In FIG. 8b, the beam current $I_E$ is switched off by using the second switch S2 to electrically connect the second voltage source 15 with the extracting electrode 19. The advantage of this design is that the emitter voltage $U_E$ difference between beam current switch on and beam current switch off can be kept small.

In FIG. 8c, the beam current $I_E$ is switched off by using the fourth switch S4 to disconnect the current source 12 from the extracting electrode 19. This makes a second voltage source obsolete for switching off the beam current.

While the foregoing is directed to embodiments of the present invention, other and further embodiments of the invention may be devised without departing from the basic scope thereof, and the scope thereof is determined by the claims that follow.

The invention claimed is:

1. A field emitter beam source comprising:
   an emitter;
   an extracting electrode to extract a beam current from the emitter:
   a first voltage source for providing a first voltage between the emitter and the extracting electrode to switch on the beam current;
   a current source for providing a predetermined beam current;
   the current source being coupled to the first voltage source; and
   a first voltage disconnecting switch for disconnecting the first voltage source from the current source, wherein the first voltage disconnecting switch is adapted to switch between a voltage control mode and a current control mode.

2. The field emitter beam source according to claim 1, comprising a second voltage source for providing a second voltage between the emitter and the extracting electrode to switch off the beam current.

3. The field emitter beam source according to claim 1, comprising a second voltage disconnecting switch to switch off the beam current.

4. The field emitter beam source according to claim 1, comprising a current source disconnecting switch for disconnecting the current source from the emitter and the extracting electrode.

5. The field emitter beam source according to claim 1, comprising a voltage control unit electrically coupled to the first voltage source to adjust the first voltage according to a measured emitter voltage.

6. The field emitter beam source according to claim 5, whereby the voltage control unit is electrically coupled to the current source to measure the measured emitter voltage.

7. The field emitter beam source according to claim 5, whereby the voltage control unit comprises a storing unit to store the measured emitter voltage; and a storing unit connecting switch to determine the time at which the measured emitter voltage is stored.

8. The field emitter beam source according to claim 5, whereby the voltage control unit comprises an n-channel MOSFET source follower and the first voltage source comprises a p-channel MOSFET source follower.

9. The field emitter beam source according to claim 3, further characterized by charge control means to control the time of switch off of the beam current according to a predetermined beam current pulse charge.

10. The field emitter beam source according to claim 9, whereby the charge control means comprise a current source disconnecting switch for disconnecting at least one of the group consisting of: the current source and a comparator for comparing the emitter voltage with a comparison voltage.

11. The field emitter beam source according to claim 10, whereby the comparator is electrically coupled to the second voltage disconnecting switch to connect the second voltage source.

12. The field emitter beam source according to claim 1, further comprising field emitter beam sources to form a field emitter beam source array.

13. The field emitter beam source according to claim 12, whereby the army of field emitter beam sources is fabricated using CMOS-technology.

14. The field emitter beam source according. to claim 1, whereby the predetermined beam current is in the range between 1 microampere and 10 picoampero.

15. The field emitter beam source array of claim 12, wherein the array of field emitter beam sources is monolithically integrated onto a substrate.

16. A field emitter beam source array, comprising:
an array of field emitter beam sources integrated onto a semiconductor substrate, wherein each field emitter beam source comprises an emitter;
wherein the array of field emitter beam sources comprises:
an extracting electrode to extract a beam current from each emitter; and
a first voltage source for providing a first voltage between each emitter and the extracting electrode to switch on the beam current;
wherein each field emitter beam source further comprises:
a current source for providing a predetermined beam current;
a first switch electrically coupled to the first voltage source to switch on
a beam current; and
a second switch to switch off the beam current.

17. The field emitter beam source array according to claim 16, whereby the second switch is coupled to a second voltage source to switch off the beam current.

18. The field emitter beam source array according to claim 16, whereby each current source is coupled to a current source disconnecting switch to disconnect the current source.

19. The field emitter beam source array according to claim 16, whereby each field emitter beam source comprises a voltage control unit to adjust the first voltage according to a measured emitter voltage.

20. The field emitter beam source array according to claim 19, whereby the voltage control unit is coupled to the current source to measure the measured emitter voltage and coupled to the first voltage source to adjust the first voltage.

21. The field erriitter beam source array according to claim 16, whereby each field emitter beam source comprises a charge control means to control a switch off time of the beam current according to a predetermined beam current pulse charge.

22. The field emitter beam source array according to claim 21, whereby the charge control means comprise:
a current source disconnecting switch for disconnecting the current source; and
a comparator for comparing the emitter voltage with a comparison voltage.

23. The field emitter beam source array according to claim 21, whereby each field emitter beam source comprises an emitter, whereby each emitter is electrically coupled to one of said current sources, one of said first switches, one of said second switches, one of said voltage control units, and one of said charge control means.

24. The field emitter beam source array according to claim 16, whereby the second voltage source is common to all field emitter beam sources.

25. The field emitter beam source array according to claim 16, whereby the number of field emitter beam sources is larger than four.

26. An electron beam device, comprising at least one of the field emitter beam sources according to claim 1.

27. A method for generating beam current pulses comprising the steps:
providing a field emitter beam source comprising:
at least one emitter;
at least one extracting electrode;
a first voltage source for providing a first voltage between the emitter and the extracting electrode to switch on the beam current;
a current source coupled to the first voltage source; and
a first voltage disconnecting switch for disconnecting the first voltage source from the current source;
providing a predetermined beam current; and
switching on the beam current by applying the first voltage between the emitter and the extracting electrode, wherein the first voltage disconnecting switch is adapted to switch between a voltage control mode and a current control mode.

28. The method according to claim 27, whereby an emitter voltage between the emitter and the extracting electrode is measured to obtain a measured emitter voltage.

29. The method according to claim 27, whereby the first voltage is adjusted to be equal to the measured emitter voltage.

30. The method according to claim 27, whereby the beam current is switched off by applying a second voltage between the emitter and the extracting electrode.

31. The method according to claim 27, whereby the predetermined beam current is provided by means of the current source.

32. The method according to claim 27, whereby the first voltage is provided by the first voltage source.

33. The method according to claim 30. whereby the second voltage is provided by the second voltage source.

34. The method according to claim 28, whereby the measured emitter voltage is obtained at a time when the predetermined beam current is provided for the emitter.

35. The method according to claim 28, whereby the measured emitter voltage is measured periodically within intervals of less than 100 s.

36. The method according to claim 29, whereby the first voltage is adjusted periodically within intervals of less than 100 s.

37. The method according to claim 29, whereby between two consecutive adjustments of the first voltage the beam current is switched on at least two times.

38. The method according to claim 29, whereby the first voltage is adjusted by means of a voltage control unit controlling the first voltage source.

39. The method according to claim 27 comprising the steps:
   disconnecting the current source, the first voltage source and the second voltage source; and
   switching off the beam current when the decreasing emitter voltage has reached a predetermined comparison voltage.

40. The method according to claim 39, whereby the switching off of the beam current is initiated by a voltage comparator means comparing the emitter voltage with the predetermined comparison voltage.

41. The method according to claim 27, whereby the predetermined beam current is in the range between 1 microampere and 10 picoampere.

42. The method according to claim 27, whereby, after switch off, the beam current is reduced by more than 50%.

43. The method according to claim 27, comprising at least one of:
   the first voltage becomes connected or disconnected from the emitter or the extracting electrode by means of a first voltage disconnecting switch;
   the second voltage becomes connected or disconnected from the emitter or the extracting electrode by means of a second voltage disconnecting switch; and
   the current source becomes connected or disconnected from the emitter or the extracting electrode by means of a current source disconnecting switch.

44. Electron beam device, comprising at least one of the field emitter beam source arrays according to claim 16.

* * * * *

UNITED STATES PATENT AND TRADEMARK OFFICE
CERTIFICATE OF CORRECTION

PATENT NO. : 7,122,805 B2
APPLICATION NO. : 10/729839
DATED : October 17, 2006
INVENTOR(S) : Hoffmann It is certified that error appears in the above-identified patent and that said Letters Patent is hereby corrected as shown below:

Column 9, Line 48: Change "varies" to --various--

Column 10, Line 6: After "can", insert --be--

Column 15, Line 57: Change "$I_s$of" to --$I_s$ of--

Column 17, Table 1, Line 7: Change "t4" to --t7--

Column 18, Line 65: After "signal", change "a" to --at--

Column 19, Line 61: Change "|Utp+☐$_p$|" to --|$U_T$p+δ$_p$|--

Column 21, Line 56: Change "2e,the" to --2e, the--

Column 23, Line 31: Insert a space between "drop" and "Δ"

Column 23, Line 36: Insert a space between "drop" and "Δ"

Column 23, Line 36: Change "3c,for" to --3c, for--

Column 23, Line 45: Insert a space between "drop" and "Δ"

Column 26, Line 52: Change "CP" to --Cp--

Column 27, Line 3: After "the", delete "a"

Column 27, Line 8: Change "6a,i.e." to --6a, i.e.--

Column 28, Claim 1, Line 39: After "current", change the semicolon to a comma

Column 29, Claim 14, Line 26: Delete the period after "according"

Column 29, Claim 14, Line 28: Change "picoampero" to --picoampere--

UNITED STATES PATENT AND TRADEMARK OFFICE
CERTIFICATE OF CORRECTION

PATENT NO. : 7,122,805 B2
APPLICATION NO. : 10/729839
DATED : October 17, 2006
INVENTOR(S) : Hoffmann It is certified that error appears in the above-identified patent and that said Letters Patent is hereby corrected as shown below:

Column 29, Claim 16, Lines 47-48: Delete the paragraph break between "on" and "a"

Signed and Sealed this

Sixteenth Day of January, 2007

JON W. DUDAS
*Director of the United States Patent and Trademark Office*